(12) United States Patent
Hirano et al.

(10) Patent No.: US 7,145,254 B2
(45) Date of Patent: Dec. 5, 2006

(54) TRANSFER-MOLDED POWER DEVICE AND METHOD FOR MANUFACTURING TRANSFER-MOLDED POWER DEVICE

(75) Inventors: Naohiko Hirano, Okazaki (JP); Takanori Teshima, Okazaki (JP); Yoshimi Nakase, Anjo (JP); Kenji Yagi, Okazaki (JP); Yasushi Ookura, Toyokawa (JP); Kuniaki Mamitsu, Okazaki (JP); Kazuhito Nomura, Okazaki (JP); Yutaka Fukuda, Kariya (JP)

(73) Assignee: Denso Corporation, Kariya (JP)

( * ) Notice: Subject to any disclaimer, the term of this patent is extended or adjusted under 35 U.S.C. 154(b) by 290 days.

(21) Appl. No.: 10/201,556

(22) Filed: Jul. 24, 2002

(65) Prior Publication Data

US 2003/0022464 A1   Jan. 30, 2003

(30) Foreign Application Priority Data

Jul. 26, 2001   (JP) ............................. 2001-225963
Mar. 26, 2002  (JP) ............................... 2002-86408

(51) Int. Cl.
  *H01L 23/10*   (2006.01)
  *H01L 23/28*   (2006.01)
(52) U.S. Cl. .................... 257/796; 257/706; 257/707
(58) Field of Classification Search ............... 257/707, 257/666, 708, 675, 720, 796, 706
  See application file for complete search history.

(56) References Cited

U.S. PATENT DOCUMENTS

| | | | |
|---|---|---|---|
| 4,141,030 A * | 2/1979 | Eisele et al. ................. 257/689 |
| 4,240,099 A | 12/1980 | Brandt et al. | |
| 4,470,063 A * | 9/1984 | Arakawa et al. ............ 257/746 |
| 4,970,579 A * | 11/1990 | Arldt et al. .................. 257/718 |
| 5,157,478 A * | 10/1992 | Ueda et al. ............ 296/100.13 |
| 5,164,815 A * | 11/1992 | Lim ........................... 257/666 |
| 5,200,809 A * | 4/1993 | Kwon ........................ 257/707 |
| 5,242,862 A | 9/1993 | Okabe et al. | |
| 5,293,301 A * | 3/1994 | Tanaka et al. .............. 361/707 |
| 5,311,060 A * | 5/1994 | Rostoker et al. ............ 257/796 |
| 5,484,959 A * | 1/1996 | Burns ........................ 174/52.4 |
| 5,574,312 A * | 11/1996 | Bayerer et al. ............. 257/706 |
| 5,594,282 A * | 1/1997 | Otsuki ........................ 257/796 |

(Continued)

FOREIGN PATENT DOCUMENTS

CN   1123515 A   5/1996

(Continued)

OTHER PUBLICATIONS

U.S. Appl. No. 09/717,227, filed Nov. 22, 2000, Mamitsu.

(Continued)

*Primary Examiner*—Carl Whitehead, Jr.
*Assistant Examiner*—James M. Mitchell
(74) *Attorney, Agent, or Firm*—Posz Law Group, PLC

(57) ABSTRACT

A semiconductor device includes a semiconductor chip that generates heat in operation, a pair of heat sinks for cooling the chip, and a mold resin, in which the chip and the heat sinks are embedded. The thickness t1 of the chip and the thickness t2 of one of heat sinks that is joined to the chip using a solder satisfy the equation of $t2/t1 \geq 5$. Furthermore, the thermal expansion coefficient $\alpha 1$ of the heat sinks and the thermal expansion coefficient $\alpha 2$ of the mold resin satisfy the equation of $0.5 \leq \alpha 2/\alpha 1 \leq 1.5$. In addition, the surface of the chip that faces the solder has a roughness Ra that satisfies the equation of $Ra \leq 500$ nm. Moreover, the solder is a Sn-based solder to suppress relaxation of a compressive stress in the chip, which is caused by the creeping of the solder.

3 Claims, 19 Drawing Sheets

U.S. PATENT DOCUMENTS

| | | | |
|---|---|---|---|
| 5,600,541 A * | 2/1997 | Bone et al. | 361/707 |
| 5,629,561 A * | 5/1997 | Shin et al. | 257/712 |
| 5,703,398 A * | 12/1997 | Sono et al. | 257/706 |
| 5,726,466 A * | 3/1998 | Nishitani | 257/181 |
| 5,828,125 A * | 10/1998 | Burns | 257/668 |
| 6,069,023 A * | 5/2000 | Bernier et al. | 438/107 |
| 6,114,413 A * | 9/2000 | Kang et al. | 523/210 |
| 6,246,111 B1 * | 6/2001 | Huang et al. | 257/675 |
| 6,329,705 B1 * | 12/2001 | Ahmad | 257/666 |
| 6,442,033 B1 * | 8/2002 | Liu et al. | 361/743 |
| 6,559,525 B1 * | 5/2003 | Huang | 257/675 |
| 6,693,350 B1 | 2/2004 | Teshima et al. | |
| 6,703,707 B1 * | 3/2004 | Mamitsu et al. | 257/718 |
| 6,734,551 B1 * | 5/2004 | Yoshihara et al. | 257/706 |
| 6,798,062 B1 | 9/2004 | Mamitsu et al. | |
| 6,853,070 B1 * | 2/2005 | Khan et al. | 257/707 |
| 2002/0074627 A1 * | 6/2002 | Combs | 257/666 |
| 2004/0070072 A1 | 4/2004 | Mamitsu et al. | |
| 2004/0089925 A1 | 5/2004 | Fukuda et al. | |
| 2004/0089940 A1 | 5/2004 | Mamitsu et al. | |
| 2004/0089941 A1 | 5/2004 | Mamitsu et al. | |
| 2004/0089942 A1 | 5/2004 | Mamistu et al. | |
| 2004/0097082 A1 | 5/2004 | Mamitsu et al. | |

FOREIGN PATENT DOCUMENTS

| | | | |
|---|---|---|---|
| JP | 356062342 | * | 5/1981 |
| JP | A-S56-146261 | | 11/1981 |
| JP | A-58-165348 | | 9/1983 |
| JP | A-61-234041 | | 10/1986 |
| JP | 63-142640 | | 6/1988 |
| JP | 04011758 | * | 1/1992 |
| JP | 404011758 | * | 1/1992 |
| JP | A-5-63113 | | 3/1993 |
| JP | 406104353 | * | 4/1994 |
| JP | A-H06-268114 | | 9/1994 |
| JP | A-6-334069 | | 12/1994 |
| JP | A-7-99272 | | 4/1995 |
| JP | A-7-153878 | | 6/1995 |
| JP | 10-116934 | | 5/1998 |
| JP | A-2000-31351 | | 1/2000 |
| JP | A-H12-031351 | | 1/2000 |
| JP | A-2000-124166 | | 4/2000 |

OTHER PUBLICATIONS

U.S. Appl. No. 10/127,613, filed Apr. 23, 2002, Teshima.

Office Action and its translation from Korean Patent Office in the corresponding Koran application dated Oct. 10, 2005.

Office Action and its translation from Chinese Patent Office in the corresponding Chinese application dated Sep. 30, 2005.

Final Rejection dated Nov. 16, 2004 issued by Japanese Patent Office (Translation attached).

* cited by examiner

| MATERIAL | BREAKING STRENGTH (MPa) | YIELD STRESS (MPa) |
|---|---|---|
| Pb-10Sn | 6-10 | 15 |
| Sn-7Sb | 11-23 | 32 |
| Sn-3.5Ag | 9-14 | 24 |
| Sn-3.5Ag-0.7Cu | 11-18 | 21 |

| MATERIAL | STRAIN RATE ($\times 10^{-2}$%/min) |
|---|---|
| Pb-10Sn | 4.0 |
| Sn-7Sb | 0.0015 |
| Sn-3.5Ag | 0.3 |
| Sn-3.5Ag-0.7Cu | 0.18 |

| MATERIAL | THERMAL EXPANSION COEFFICIENT |
|---|---|
| SILICON | 3.0ppm |
| Cu | 17ppm |
| Al | 23ppm |
| Mo-35Cu | 8.0ppm |

TRANSFER-MOLDED POWER DEVICE AND METHOD FOR MANUFACTURING TRANSFER-MOLDED POWER DEVICE

CROSS REFERENCE TO RELATED APPLICATION

This application is based on and incorporates herein by reference Japanese Patent Applications No. 2002-196140 filed on Jul. 4, 2002, No. 2001-225963 filed on Jul. 26, 2001, and No. 2002-86408 filed on Mar. 26, 2001.

BACKGROUND OF THE INVENTION

The present invention relates to a transfer molded power device, which includes a semiconductor chip that generates heat in operation and a heat sink for cooling the semiconductor chip.

A power device, which includes a semiconductor chip and only one heat sink, which is a copper plate for heat release and also functions as an electrode, is proposed. In the power device, power and ground lines are provided as bonding wires. However, this type of power device has the following problems when the semiconductor chip is downsized for reducing the manufacturing costs. For the downsizing, it becomes necessary to reduce the number of bonding wires, so it becomes impossible to supply a predetermined rated current. Furthermore, although the semiconductor chip operates at a higher speed as the device downsized, the downsizing leads to a larger inductance and increased surge. In addition, the semiconductor chip generates more heat per volume when drawing the predetermined rated current. Therefore, the otherwise lower temperature of the semiconductor chip becomes higher in operation unless the heat is released more efficiently.

In order to address the problem described above, a semiconductor device that includes two heat sinks is proposed. Because heat is released from two sides of the semiconductor chip to the two heat sinks respectively, the later proposed semiconductor device offers improved heat release efficiency compared with the former proposed power device that has only one heat sink. Although the later proposed semiconductor device is molded with a mold resin, the surfaces of the two heat sinks that are opposite from the surfaces facing respectively the semiconductor chip are exposed for improving heat release efficiency.

However, in the later proposed semiconductor device, the semiconductor chip and the heat sinks are relatively very different in thermal expansion coefficient from each other. Therefore, a relatively large stress can be generated in the semiconductor chip under thermal cycling while the later semiconductor device is in operation, and the semiconductor chip is destroyed in the worst case. Specifically, when the later proposed semiconductor device is manufactured, the heat sinks are soldered to the semiconductor chip in a reflow process, in which solders are heated to a predetermined temperature at a heating step to melt the solders and cooled to harden the solders at a subsequent cooling step. To be specific, the semiconductor chip and the heat sinks in the later proposed semiconductor device are substantially made of a single-crystal silicon and copper, respectively. Therefore, due to the difference in thermal expansion coefficient between single-crystal silicon and copper, 3.0 ppm and 17 ppm respectively as shown in FIG. 29, the semiconductor chip and the heat sinks respectively have a compressive stress and a tensile stress directly after the cooling step in the reflow process, as shown in FIG. 30.

When the later proposed semiconductor device is placed at room temperature after the cooling step, the stresses gradually relaxes due to the creeping of the solder connecting the semiconductor chip and the heat sinks. If the stress relaxes sufficiently, a tensile stress is generated in the semiconductor chip due to the difference in thermal expansion coefficient between single-crystal silicon and copper when the semiconductor device is heated again by the heat generated in the semiconductor chip during operation or by the heat from the surrounding environment. While the single crystal silicon that makes up the semiconductor chip remains intact even under more than 600 MPa of compressive stress, the single crystal silicon can be destroyed under a tensile stress of 100 MPa. Therefore, it is the tensile stress that destroys the semiconductor chip in the later semiconductor device.

The semiconductor chip includes p-type base regions and $n^+$-type source regions, which are located in a front surface of an n-type silicon substrate, and a drain electrode, which is located on a back surface of the n-type silicon substrate. The front surface and the back surface face in the opposite direction. In a proposed method for manufacturing the semiconductor chip, a semiconductor wafer of n-type silicon, from which a plurality of the semiconductor chips are made, is thinned in order to reduce the thickness of the semiconductor chip because the ON resistance of the semiconductor chip is lowered by shortening a current path.

Specifically, in a proposed method, the base and source regions, a metallization layer, and a passivation film (SiN film or PIQ film) are formed on a front surface of the wafer, and then the wafer is thinned. Next, a back side electrode layer is formed on a back surface of the wafer. The front surface and the back surface of the wafer face in the opposite direction. In the proposed method, the wafer is thinned entirely before the back side electrode layer is formed, so the wafer is susceptible to warping and becomes fragile in later manufacturing steps.

In the proposed method for manufacturing the semiconductor chip, an n+ region is formed in the back surface of the wafer as an impurity diffusion region for the electric contact between the wafer and the back side electrode layer. Then, the back side electrode layer is formed in contact with the $n^+$ region.

To form the n+ region, either an ion implanting method or a thermal diffusion method is used. The ion implanting method requires an annealing at 500° C. to 700° C. for activating implanted ions close to 100%. In addition, a relatively heavy dose is needed for achieving a relatively high impurity concentration. On the other hand, the thermal diffusion method requires a higher temperature and longer time period than the ion implanting method. However, in both methods, because the $n^+$ region is formed after the metallization layer is formed on the front surface of the wafer, the annealing must be conducted at a temperature lower than the temperature at which the metallization layer softens. For example, when aluminum film is used, the anneal temperature needs to be lower than 450° C. Therefore, in the proposed method, the annealing effect is not sufficient.

SUMMARY OF THE INVENTION

The present invention has been made in view of the above aspects with an object to provide a semiconductor device that includes a semiconductor chip that stays intact even under a large thermal stress while preventing a mold resin from delaminating and preventing a solder from breaking, so that a long term reliability of the semiconductor device is assured. Another object of the present invention is to provide a method for manufacturing the semiconductor chip. With the method, a fragility of a semiconductor wafer in the manufacturing process of the semiconductor device is improved, and at the same, an electric contact between the wafer and a back surface electrode is achieved at a relatively low temperature.

To achieve the former object, a semiconductor chip has a thickness t1 and one of heat sinks has a thickness t2 such that the thickness t1 and the thickness t2 satisfy the following equation.

$$t2/t1 \geq 5$$

By setting the thicknesses this way, the otherwise insufficient compressive stress, which is generated in the semiconductor chip right after a cooling step in a reflow process, is increased. Therefore, the otherwise insufficient tensile stress, which is generated in the semiconductor chip during thermal cycling in the operating environment of the semiconductor device, is reduced. Furthermore, each heat sink has a thermal expansion coefficient $\alpha 1$ and a mold resin has a thermal expansion coefficient $\alpha 2$ such that the thermal expansion coefficients $\alpha 1$ and $\alpha 2$ satisfy the following equation.

$$0.5 \leq \alpha 2/\alpha 1 \leq 1.5$$

In addition, the semiconductor chip is has a surface roughness Ra at the surface that joins the heat sink satisfies the following equation.

$$Ra \leq 500 \text{ nm}$$

Moreover, the solder is a Sn-based solder to suppress the relaxation of the compressive stress in the semiconductor chip.

To achieve the later object, an impurity diffusion region is formed in a front surface of the wafer, and then a back surface of the wafer is polished to a first predetermined thickness. The front and back surfaces face in the opposite direction. Then, the wafer is etched from the back surface, except at the periphery of the wafer, to a second predetermined thickness. Then, an impurity-doped polysilicon film is formed on the back surface, and an impurity diffusion region is formed for achieving an electric contact between the wafer and the back surface electrode by diffusing impurities from the polysilicon film into the back surface at a relatively low temperature.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The present invention will be described in detail with reference to various embodiments.

First Embodiment

Figure 1:
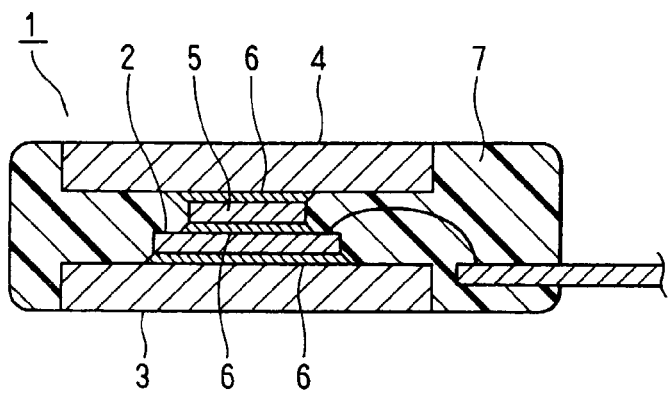
FIG. 1 is a schematic cross sectional view of the semiconductor device according to the first through fifth embodiments of the present invention.
Figures 29, 30:
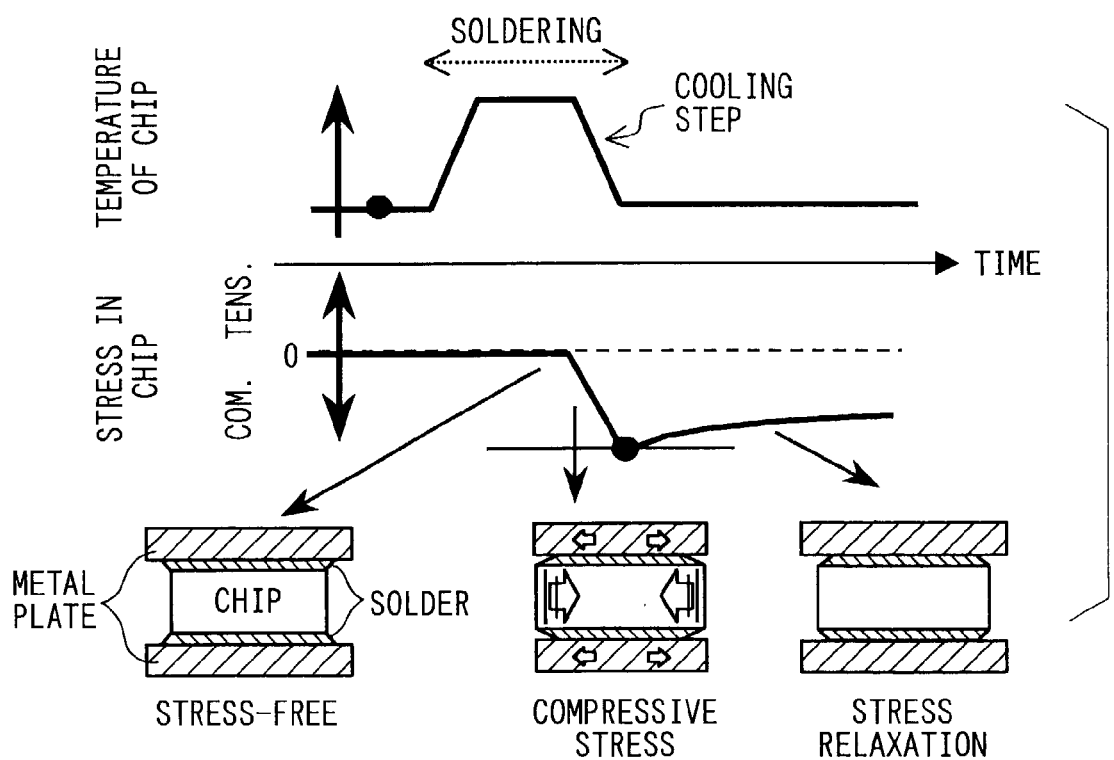
FIG. 29 is a table showing the thermal expansion coefficient of materials.
FIG. 30 is a schematic time chart showing the variations in temperature and internal stress of the semiconductor chip.

As shown in FIG. 1, a semiconductor device 1 according to the first embodiment has a similar configuration to the proposed semiconductor device 1A in FIG. 29. The semiconductor device 1 includes a semiconductor chip 2, a lower heat sink 3 (first metal plate), an upper heat sink 4 (second metal plate), and a bridging chip 5 (third metal plate). As viewed in FIG. 1, a lower surface (first surface) of the semiconductor chip 2 and an upper surface of the lower heat sink 3 are joined by a solder 6 (bonding layer). Furthermore, an upper surface (second surface) of the semiconductor chip 2 and a lower surface of the bridging chip 5 are also joined by another solder 6. An upper surface of the bridging chip 5 and a lower surface of the upper heat sink 4 are also joined by other solder 6. The semiconductor chip 2 in FIG. 1 releases heat from both sides of the semiconductor chip 2 through the heat sinks 3, 4.

Figure 2A:
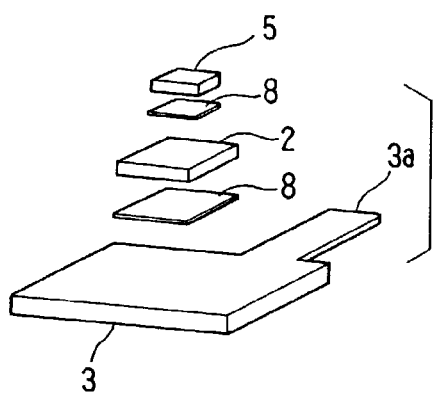
FIGS. 2A to 2E are views showing manufacturing steps for the semiconductor device according to the first through fifth embodiments.
Figure 2B:
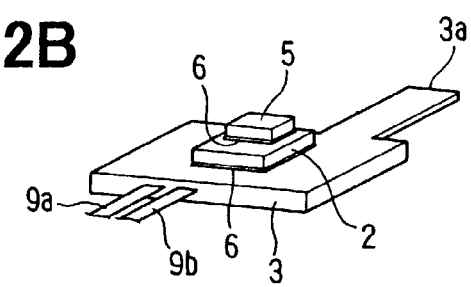

The semiconductor chip 2 in FIG. 1 is a vertical power MOS transistor. However the semiconductor chip 2 may be other power devices such as an IGBT and a thyristor. The shape of the semiconductor chip 2 in FIG. 1 is substantially in the shape of a rectangular thin plate, as shown in FIG. 2A. The lower heat sink 3, the upper heat sink 4, and the bridging chip 5 are made of a metal with a relatively high thermal conductance and a relatively high electrical conductance such as copper and aluminum. The lower heat sink 3 and the upper heat sink 4 are connected electrically to main electrodes such as a collector electrode and an emitter electrode of the semiconductor chip 2 through the solders 6 and the bridging chip 5.

As shown in FIG. 2A, the lower heat sink 3 is substantially in the shape of a rectangular plate and has a lead 3a protruding backward. The bridging chip 5, also shown in FIG. 2A, is substantially in the shape of a rectangular plate and is slightly smaller than the semiconductor chip 2. The upper heat sink 4, as shown in FIG. 2D, is substantially in the shape of a rectangular plate and has a lead 4a protruding backward. The position of the lead 3a of the lower heat sink 3 and the position of the lead 4a of the upper heat sink 4 are offset from each other, so that the leads 3a, 4a avoid facing each other. In the semiconductor device 1 in FIG. 1, in which proportions in size are exaggerated, a distance between the upper surface of the lower heat sink 3 and the lower surface of the upper heat sink 4 are 1 mm to 2 mm.

As shown in FIG. 1, the semiconductor chip 2, the bridging chip 5, and the heat sinks 3, 4 are embedded in an epoxy resin 7 by transfer molding. For the transfer molding, a mold consisting of a top part and a bottom part, which are not illustrated, is used. In order to enhance the adhesion between the resin 7 and the heat sinks 3, 4, the adhesion between the resin 7 and the semiconductor chip 2, and the adhesion between the resin 7 and the bridging chip 5, it is preferred that a coating resin, which is not illustrated, such as a polyamide resin is located between the resin 7 and each of the heat sinks 3, 4, the bridging chip 5, and the chip 2.

The semiconductor device 1 in FIG. 1 is manufactured as follows. Firstly, as shown in FIG. 2A, a solder foil 8 and the chip 2 are stacked in this order on the upper surface of the lower heat sink 3, while another solder foil 8 and the bridging chip 5 are stacked in this order on top of the chip 2. Then, the solder foils 8 are melted in a reflow system, which is a heating system, and hardened to solder the semiconductor chip 2 and the bridging chip 5 onto the upper surface of the lower heat sink 3 and the upper surface of the semiconductor chip 2, respectively.

Figure 2C:
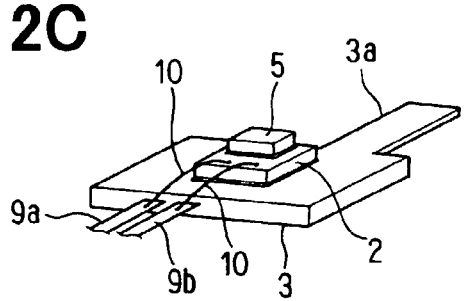
Figure 2D:
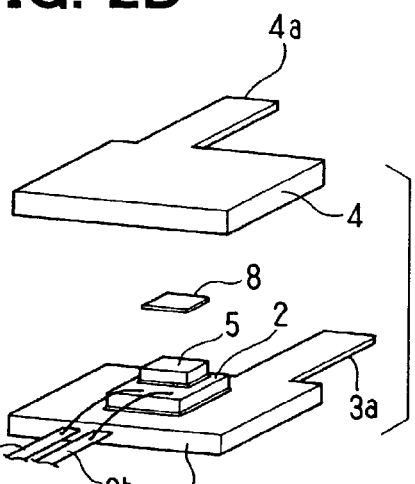
Figure 2E:
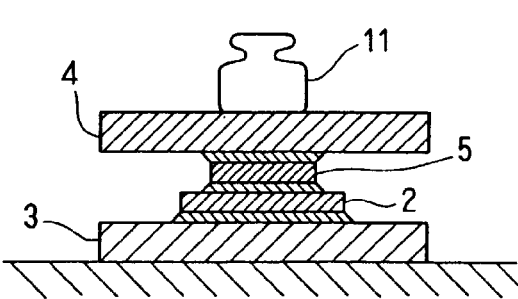

Then, as shown in FIG. 2C, control electrodes such as gate pads on the chip 2 are wire bonded to lead frames 9a and 9b with bonding wires 10, which are made of aluminum or gold. The bonding wires 10 electrically connect the control electrodes on the chip 2 and the lead frames 9a and 9b. Then, as shown in FIG. 2D, a solder foil 8 and the upper heat sink 4 are stacked in this order on top of the bridging chip 5. The solder foil 8 is melted in the reflow system and hardened to solder the upper heat sink 4 on top of the bridging chip 5. As shown in FIG. 2E, a weight 11 is placed on top of the upper heat sink 4 to press the upper heat sink 4 downward during the soldering. At the same time, a spacer jig, which is not illustrated, is placed between the upper heat sink 4 and the lower heat sink 3 in order to maintain a predetermined distance between the upper heat sink 4 and the lower heat sink 3.

The distance between the upper heat sink 4 and the lower heat sink 3 is set to be larger than the predetermined distance set by the spacer jig, before the solder foil 8 between the upper heat sink 4 and the bridging chip 5 is melted. As the solder foil 8 melts, the pressure from the weight 11 makes the melting solder layer thinner and makes the distance between the upper heat sink 4 and the lower heat sink 3 the same as the distance set by the spacer jigs. The solders 6, which are formed from the solder foils 8, are designed to achieve an appropriate thickness. Once the melted solder layer hardens, the chip 2, the heat sinks 3, 4, and the bridging chip 5 are soldered and electrically connected by the solders 6. Subsequently, a polyamide resin is coated on the surfaces of the heat sinks 3, 4, the bridging chip 5, and the chip 2. The coating may be implemented by, for example, immersing in a solution containing the polyamide resin or by dripping or spraying the solution containing the polyamide resin from a dispensing nozzle. The polyamide resin should be coated as needed, so polyamide resin coating may not be necessary.

After the polyamide resin is coated, the resin 7 is filled around and between the heat sinks 3 and 4 by transfer molding, which is not illustrated. Once the resin 7 is hardened, the semiconductor device 1 is taken out of the mold. In the transfer molding, the molding is implemented such that the lower surface of the lower heat sink 3 and the upper surface of the upper heat sink 4 are exposed in order to improve the heat release efficiency of the heat sinks 3, 4.

In the semiconductor device 1 shown in FIG. 1, the thickness t1 of the semiconductor chip 2 and the thickness t2 of the lower heat sink 3 satisfy the following equation.

$$t2/t1 \geq 5$$

In the semiconductor device 1 shown in FIG. 1, the thickness of the upper heat sink 4 is also t2. However, the thickness of the upper heat sink 4 does not need to be t2. By setting the thicknesses t1 and t2 to satisfy the above equation, it is possible to increase the compressive stress generated in the semiconductor chip 2 and reduce the shear stress at the surface of the semiconductor chip 2, as described below.

Figure 3:
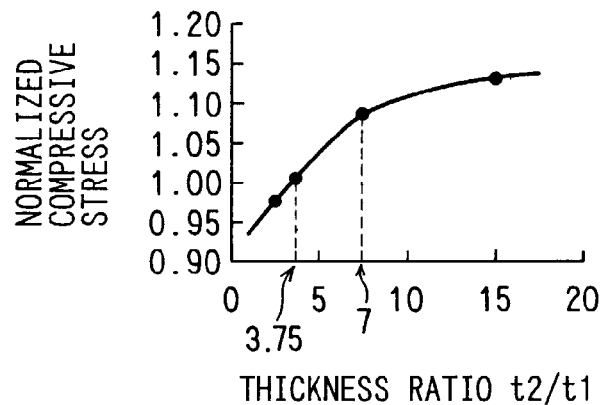
FIG. 3 is a graph showing the correlation between the normalized compressive stress and the thickness ratios.

The graph in FIG. 3 plots the thickness ratio on the X-axis and the normalized compressive stress on the Y-axis for a plurality of semiconductor devices 1 that have actually been prototyped. The compressive stress values in the prototypes are normalized by the compressive stress value of the semiconductor 1 having a thickness ratio of 3.75. When the prototyped semiconductor devices 1 that had a thickness ratio of 3.75 and a normalized compressive stress of 1.00 was exposed to thermal cycles with relatively large temperature differences, the semiconductor chip 2 in the prototyped semiconductor device 1 cracked. When the prototyped semiconductor device 1 that had a thickness ratio of 2.5 and a normalized compressive stress of 0.98 was exposed to the thermal cycles, the semiconductor chip 2 in the prototyped semiconductor device 1 also cracked.

On the other hand, when the prototyped semiconductor device 1 that had a thickness ratio of 7.00 and a normalized compressive stress of 1.09 and the prototyped semiconductor device 1 that had a thickness ratio of 15.00 and a normalized compressive stress of 1.13 were exposed to the thermal cycles, the semiconductor chips 2 in the prototyped semiconductor devices 1 were intact. In other words, the larger the thickness ratio or the larger the compressive stress in the device 1, the less likely the semiconductor chip 2 is to crack. Therefore, by setting the thickness ratio t2/t1 to be greater than 5.00, the compressive stress in the device 1 remains high enough, and the device 1 is not destroyed even when the semiconductor device 1 is exposed to a relatively large thermal stress. As a result, a long term reliability of the semiconductor device 1 is improved.

Figure 4:
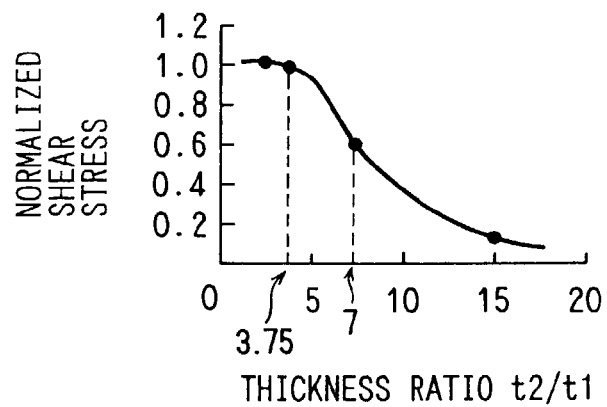
FIG. 4 is a graph showing the correlation between the shear stress ratios and the thickness ratios.

The shear stresses at the surface of the semiconductor chip 2 in the various prototypes of the semiconductor devices 1 have been calculated by simulation. A graph in FIG. 4 plots the thickness ratio t2/t1 on the X-axis and the normalized shear stress on the Y-axis for the plurality of semiconductor devices 1. The sheer stress values in the prototypes are normalized by the sheer stress in the semiconductor 1 having a thickness ratio of 3.75. When the prototyped semiconductor devices 1 that had a thickness ratio of 3.75 and a normalized shear stress of 1.00 was exposed to the thermal cycles, the resin 7 in contact with the surface of the semiconductor chip 2 delaminated. When the prototyped semiconductor device 1 that had a thickness ratio of 2.5 and a normalized shear stress of 1.02 was exposed to the thermal cycles, the resin 7 in contact with the surface of the semiconductor chip 2 also delaminated.

On the other hand, when the prototyped semiconductor device 1 that had a thickness ratio of 7.00 and a normalized shear stress of 0.6 and the prototyped semiconductor device 1 that had a thickness ratio of 15.00 and a normalized shear stress of 0.15 were exposed to the thermal cycles, the resin 7 in contact with the surfaces of the semiconductor chips 2 did not delaminate. In other words, the larger the thickness ratio t2/t1 or the smaller the shear stress of the semiconductor chips 2, the less likely the semiconductor chip 2 is to delaminate at the surface of the semiconductor chip 2. Therefore, the resin 7 in contact with the chip 2 is prevented from delaminating by setting the thickness ratio t2/t1 to be greater than 5.00 even when the semiconductor device 1 is exposed to a relatively large thermal stress. As a result, the long term reliability of the semiconductor device 1 is further improved.

As described above, a higher thickness ratio is preferred in the semiconductor device in FIG. 1. The thickness ratio is increased by reducing the thickness t1 of the semiconductor chip 2. There is another advantage in reducing the thickness t1. That is, the device's ON resistance can be simultaneously reduced, because a resistance in the chip 2 is lowered for a vertical current path in the vertical direction of FIG. 1. The thickness ratio is also increased by increasing the thickness t2 of the lower heat sink 3. There is another advantage in increasing the thickness t2. That is, the heat release efficiency of the lower heat sink 3 can be simultaneously improved.

However, it is impossible to make the thickness t1 of the semiconductor chip 2 smaller than 0.1 mm due to practical limitation in manufacturing. On the other hand, when the lower heat sink 3 is thickened, the entire semiconductor device 1 becomes thicker. Therefore, the practical maximum thickness t2 of the lower heat sink 3 is approximately 2.5 mm. Thus, the largest possible thickness ratio is practically about 25. Considering the manufacturability of the chip 2 and the restrictions imposed by device applications, the optimal thickness ratio is approximately 7 to 8.

Figures 31A, 31B:
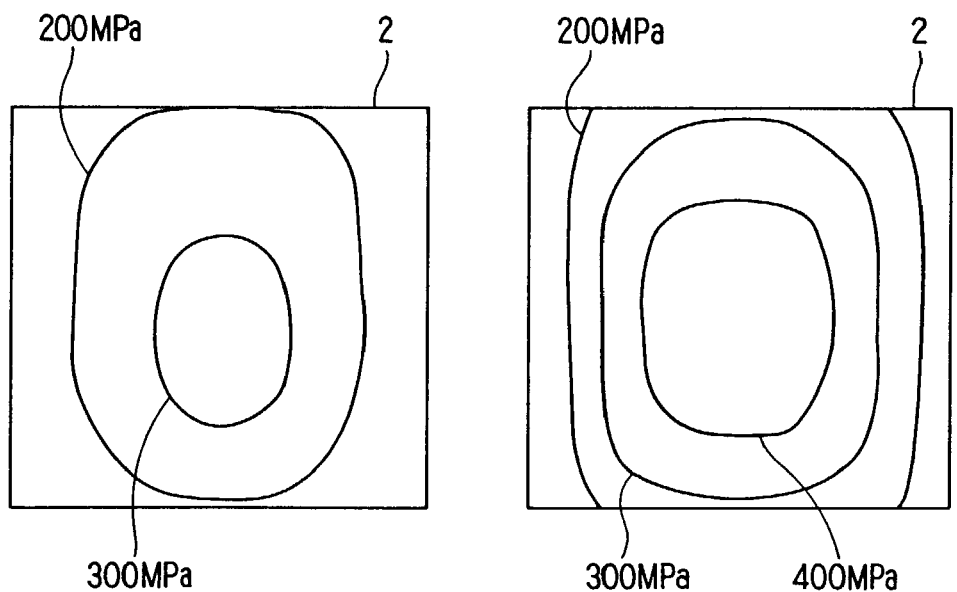
FIGS. 31A and 31B are graphs showing the distribution of internal stress of the semiconductor chip.

The compressive stress distribution in the semiconductor chip 2 in the semiconductor device 1 has been calculated by simulation. FIG. 31A shows the distribution in the case that the semiconductor chip 2 has a thickness of 0.4 mm. FIG. 31B shows the distribution in the case that the semiconductor chip 2 has a thickness of 0.2 mm. As shown in FIGS. 31A and 31B, the compressive stress increases as the thickness t1 is reduced. The reason for this is that the rigidity of the semiconductor chip 2 decreases and the semiconductor chip 2 becomes readily compressed as the thickness t1 is reduced. Therefore, by reducing the thickness t1, the shear stresses at the upper and lower surfaces of the semiconductor chip 2 decreases.

Figure 32:
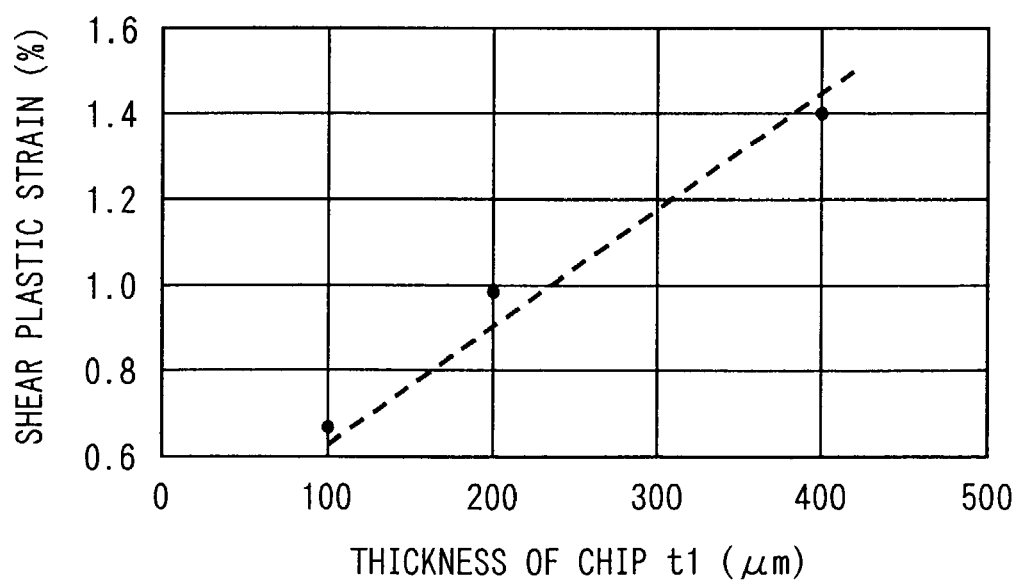
FIG. 32 is a graph showing the correlation between the shear plastic strain and the thickness of the semiconductor chip.

Moreover, as shown in FIG. 32, the strain component in the solders 6, which are in contact with the semiconductor chip 2, decreases as the thickness t1 is reduced. Especially, when the semiconductor chip 2 is thinner than 250 µm, the shear plastic strain is smaller than approximately 1% and the durability of the semiconductor device 1 in heat cycles is improved, as shown in FIG. 34.

Figure 34:
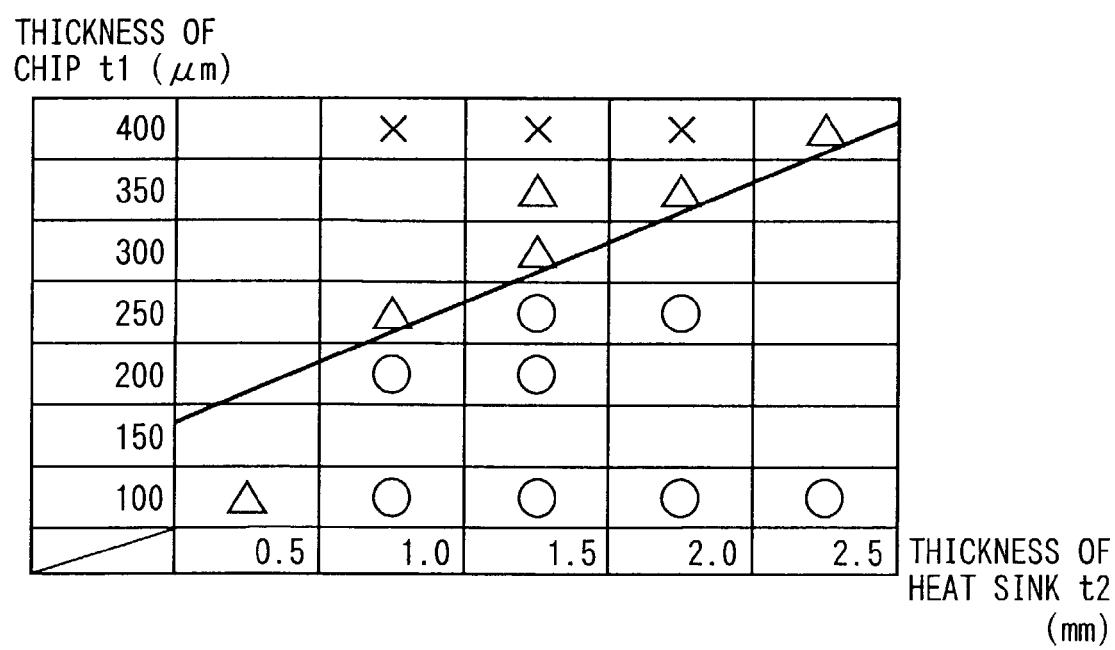
FIG. 34 is a graph showing the correlation between the thickness of the heat sinks, the thickness of the semiconductor chip, and the durability evaluation results.

In FIG. 34, the results in durability evaluation are shown as a matrix using three symbols, that is, a circle, a triangle, and a cross, for a plurality of semiconductor devices 1 that have actually been prototyped. The circle means that none of the semiconductor chips 2 in the prototyped semiconductor devices 1 has broken. The triangle means that some of the semiconductor chips 2 have broken. The cross means that all of the semiconductor chips 2 have broken. As shown in FIG. 34, the semiconductor chips 2 in the prototyped semiconductor devices 1, in which the thickness t1 of the semiconductor chip 2 and the thickness t2 of the lower heat sink 3 satisfy the equation of $t2/t1 \geq 5$, provide a preferable durability.

It is preferred that a relatively rigid material be used for the lower heat sink 3 because the more rigid the material, the greater is the compressive stress generated in the semiconductor chip 2. Specifically, it is desirable to use a metal or an alloy having a Young's modulus greater than 100 GPa at room temperature for the lower heat sink 3. A material having a Young's module greater than 100 GPa is rigid enough to provide the semiconductor chip 2 with a large enough compressive stress. Examples of metals and alloys that meet the above requirement for the Young's modulus for the lower heat sink 3 are copper, copper alloys, aluminum, aluminum alloys, and so on.

The solder 6 that joins the semiconductor chip 2 and the lower heat sink 3 in the semiconductor device 1 in FIG. 1 may be made of two-component solders such as Sn—Pb, Sn—Ag, Sn—Sb, and Sn—Cu, or multi-component solders. Furthermore, the resin 7 for molding may be made of an epoxy-type resin and so on. The thicknesses of the lower heat sink 3 and the upper heat sink 4 in the semiconductor device 1 in FIG. 1 are not necessarily equal. It is possible that only the thickness of the lower heat sink 3 is set at t2, while the upper heat sink 4 has a different thickness. In addition, the upper heat sink 4 and the bridging chip 5 may be integrated as a single component as long as the alignment between the component and the semiconductor chip 2 is possible and the control electrodes on the chip 2 can be wire bonded to the lead frames 9a and 9b with the bonding wires 10 in the manufacturing process of the semiconductor device 1.

Second Embodiment

In the semiconductor device 1, which is shown in FIG. 1, according to the second embodiment, the thermal expansion coefficient $\alpha 1$ of the heat sinks 3, 4 and the thermal expansion coefficient $\alpha 2$ of the resin 7 are set to satisfy the following equation.

$$0.5 \leq \alpha 2/\alpha 1 \leq 1.5$$

By setting the thermal expansion coefficients $\alpha 1$ and $\alpha 2$ this way, it is possible to balance the tensile stress in the semiconductor chip 2 and the shear stress at the surface of the semiconductor chip 2, as described below.

Figure 5:
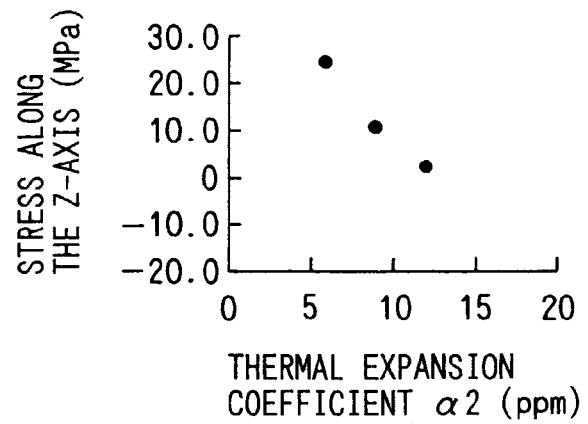
FIG. 5 is a graph showing the correlation between the stress in the semiconductor chip along the Z-axis and the thermal expansion coefficient of the resin.
Figure 33:
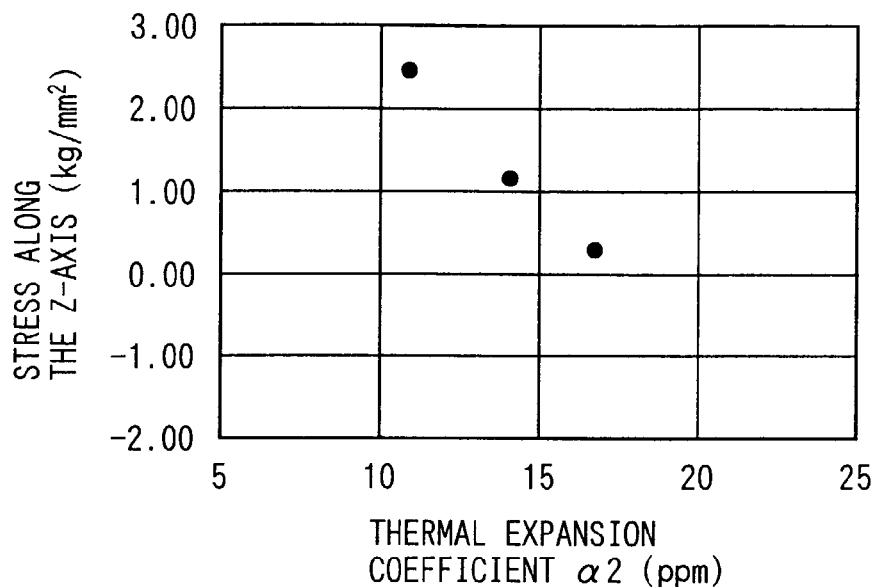
FIG. 33 is a graph showing the correlation between the stress along the Z-axis and the thermal expansion coefficient of the resin.

As shown in FIGS. 5 and 33, the tensile stress in the semiconductor chip 2 at an end of the chip 2 decreases as the coefficient $\alpha 2$ of the resin 7 is increased. The tensile stress is the stress along the Z-axis, which is in the vertical direction of FIG. 1, and has been calculated by simulation for various semiconductor devices 1 having a different thermal expansion coefficient $\alpha 2$ for the resin 7. In the graph in FIGS. 5 and 33, the X-axis represents the thermal expansion coefficient $\alpha 2$ for the resin 7, and the Y-axis represents the stress along the Z-axis. In the simulation, the heat sinks 3, 4 of the semiconductor device 1 are presumed to be made of copper, which has a thermal expansion coefficient $\alpha 1$ of 17 ppm. As shown in FIGS. 5 and 33, the larger the thermal expansion coefficient $\alpha 2$ of the resin 7, the smaller the tensile stress along the Z-axis. That is, the larger the thermal expansion coefficient $\alpha 2$ of the resin 7, the smaller the tensile stress in the semiconductor chip 2 in thermal cycles with relatively large temperature differences.

Figure 6:
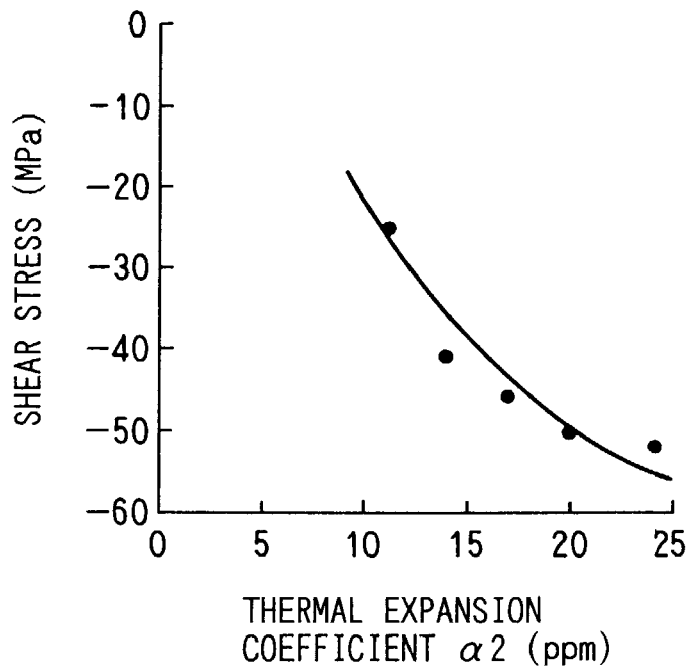
FIG. 6 is a graph showing the correlation between the shear stress of the semiconductor chip and the thermal expansion coefficient of the resin.

However, as shown in FIG. 6, the shear stress at the surface of the semiconductor chip 2 decreases as the coefficient $\alpha 2$ is increased. The shear stress has been calculated by simulation for various semiconductor devices 1 having a different thermal expansion coefficient $\alpha 2$ for the resin 7. The sheer stress needs to be small to prevent the resin 7 from delaminating from the surface of the semiconductor chip 2 under a relatively large thermal stress. However, according to experimental results using five semiconductor devices 1, which have actually been prototyped to have the five coefficients $\alpha 2$ in FIG. 6, as long as the thermal expansion coefficient $\alpha 2$ is smaller than 25 ppm, where $\alpha 2/\alpha 1$ is approximately 1.5, the resin 7 does not delaminate under the relatively large thermal stress, and the semiconductor chips 2 in the prototyped semiconductor devices 1 are intact.

Figure 7:
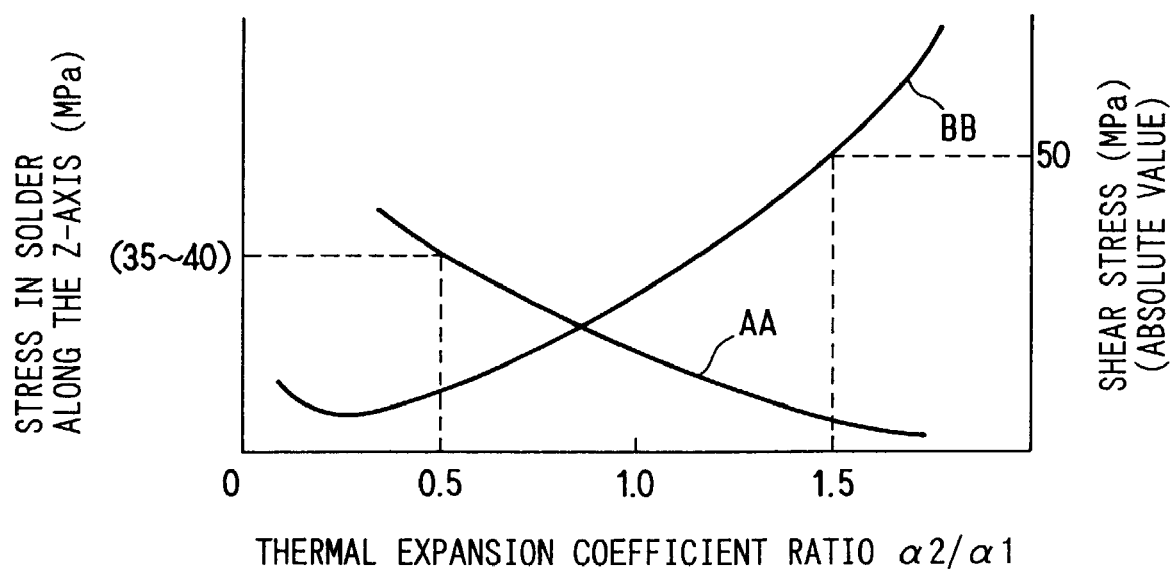
FIG. 7 is a graph showing the correlation between the stress in the solder along the Z-axis and the thermal expansion coefficient of the resin and the correlation between the absolute values for the sheer stress and the thermal expansion coefficient of the resin.

In FIG. 7, the X-axis represents the thermal expansion coefficient ratio $\alpha 2/\alpha 1$, and the left Y-axis represents the stress in the solder 6 along the Z-axis, and the right Y-axis represents the absolute values of the sheer stress at the surface of the semiconductor chip 2. The two curves, AA and BB, in FIG. 7 show the correlation between the stress along the Z-axis and the thermal expansion coefficient ratio $\alpha 2/\alpha 1$ and the correlation between the shear stress and the thermal expansion coefficient ratio $\alpha 2/\alpha 1$, respectively.

In FIG. 7, the upper limit value for the stress along the Z-axis is 35 to 40 MPa, because the solder 6 that joins the semiconductor chip 2 and the heat sinks 3, 4 has a practical maximum tensile strength of 35–40 MPa and the solder 6 can be broken with a tensile stress larger than 40 MPa. Therefore, the thermal expansion coefficient ratio $\alpha 2/\alpha 1$ must be greater than 0.5. On the other hand, the upper limit value for the shear stress is approximately 50 MPa to prevent the resin 7 from delaminating not only from the surface of the semiconductor chip 2 but from the surfaces of the heat sinks 3, 4. Therefore, the thermal expansion coefficient ratio $\alpha 2/\alpha 1$ must be smaller than 1.5. Thus, the thermal expansion coefficients $\alpha 1$ and $\alpha 2$ need to satisfy the equation, $0.5 \leq \alpha 2/\alpha 1 \leq 1.5$. As long as the structure of the semiconductor device 1 meets this condition, the semiconductor chip 2 is prevented from cracking even under a relatively large thermal stress and long term reliability is enhanced.

According to experiment results, when the heat sinks 3 4 are made of copper or a copper alloy, both of which have a thermal expansion coefficient $\alpha 1$ approximately 17 ppm, it is preferred that the thermal expansion coefficient $\alpha 2$ of the resin 7 be greater than 10 ppm. Moreover, when the heat sinks 3 4 are made of a copper sintered alloy or a compound material that includes copper, both of which have a thermal expansion coefficient $\alpha 1$ of approximately 8 ppm, it is preferred that the thermal expansion coefficient $\alpha 2$ of the resin 7 be greater than 6 ppm.

In the semiconductor device 1 in FIG. 1, the resin 7 has a Young's modulus of greater than 10 GPa. In consideration of the overall balance of the stress in the semiconductor device 1, it is desirable that the Young's modulus in the resin 7, which is used for protecting the device 1, be greater than 10 GPa.

In the semiconductor device 1 in FIG. 1, the thermal expansion coefficient $\alpha 1$ of the heat sinks 3, 4 and the thermal expansion coefficient $\alpha 2$ of the resin 7 are set to satisfy the equation, $0.5 \leq \alpha 2/\alpha 1 \leq 1.5$ while the thickness t1 of the semiconductor chip 2 and the thickness t2 of the lower heat sink 3 are set to satisfy the equation, $t2/t1 \geq 5$, which is the one according to the first embodiment. However, the condition for the thermal expansion coefficients $\alpha 1$ and $\alpha 2$ and the condition for the thickness ratio t2/t1 may be applied separately. Even in that case, substantially the same effects are provided.

Third Embodiment

In the semiconductor device 1 in FIG. 1, according to the third embodiment of the present invention, the surface roughness Ra of the lower surface of the semiconductor chip 2, which faces the lower heat sink 3 satisfies the following equation.

$$Ra \leq 500 \text{ nm}$$

Figure 8:
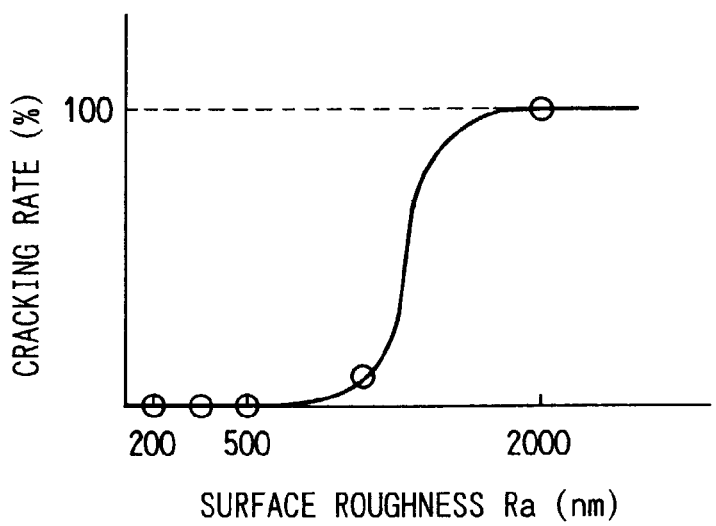
FIG. 8 is a graph showing the correlation between the cracking percentage of the semiconductor chip and the surface roughness of the semiconductor chip.

As shown in FIG. 8, if the roughness Ra is equal to 500 nm or smaller, it is possible to prevent the semiconductor chip 2 from cracking under a relatively large thermal stress. FIG. 8 shows the percentage of the semiconductor chip 2 that broke when various prototypes of the semiconductor device 1, which have a different surface roughness Ra, are exposed to the thermal stress.

In the semiconductor device 1 in FIG. 1, the roughness Ra of the lower surface of the semiconductor chip 2 satisfies an equation of Ra≦500 nm, while the condition for the thickness ratio t2/t1 according to the first embodiment and the condition for the thermal expansion coefficients α1, α2 according to the second embodiment are satisfied. However, the condition for the roughness Ra according to the third embodiment may be applied singly. Even in that case, substantially the same effects are provided.

Fourth Embodiment

Figure 9:
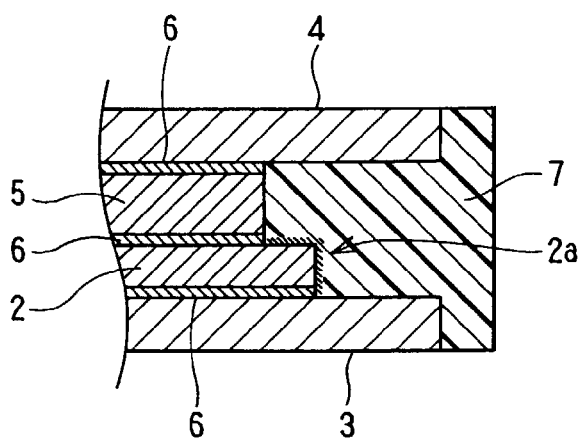
FIG. 9 is a partial cross-sectional view of the semiconductor device in FIG. 1.

In the semiconductor device 1 in FIG. 1, according to the fourth embodiment of the present invention, the thickness t2 of the heat sinks 3, 4 is approximately 1.5 mm and the thickness t1 of the semiconductor chip 2 is equal to 250 µm or smaller to prevent the resin 7 from delaminating at the edges 2a of the semiconductor chip 2, which is shown in FIG. 9.

Figure 10:
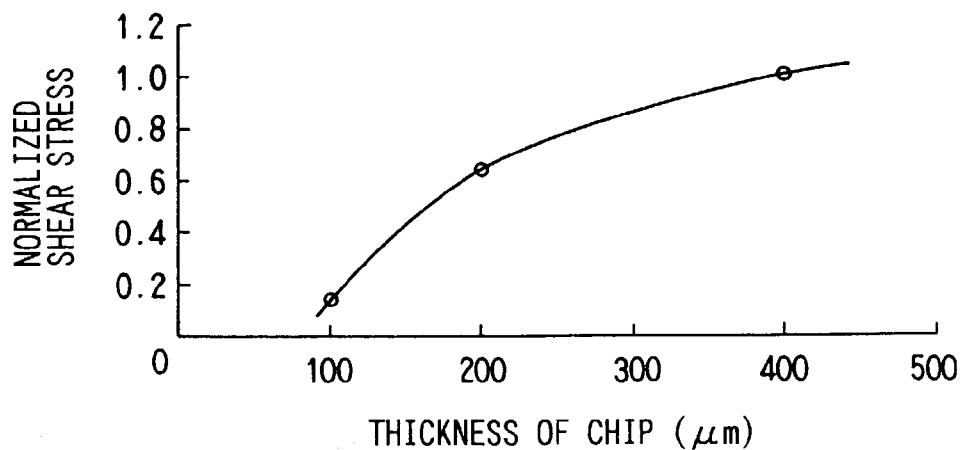
FIG. 10 is a graph showing the correlation between the normalized sheer stress and the thickness of the semiconductor chip.

The shear stress at the surface of the semiconductor chip 2 in the semiconductor device 1 has been calculated by simulation, in which the thickness t2 of the heat sinks 3, 4 is approximately 1.5 mm and the thickness t1 of the semiconductor chip 2 is varied as parameter. In the graph in FIG. 10, the X-axis represents the thickness of the semiconductor chip 2, and the Y-axis represents the normalized shear stress at the surface of the chip 2. The sheer stress values are normalized by the shear stress value of the semiconductor chip 2 having a thickness of 400 µm, that is, a thickness ratio t2/t1 of 3.75. As shown by FIG. 10, the thinner the semiconductor chip 2, the smaller the shear stress of the semiconductor chip 2.

On the other hand, according to experimental results, the resin 7 delaminates from the surface edges 2a of the semiconductor chip 2, when the semiconductor chip 2 having a thickness of 400 µm, where the shear stress ratio is 1.00, is exposed to thermal cycles with relatively large temperature differences. However, when the semiconductor device 1 includes the semiconductor chip 2 having a thickness of 200 µm, that is, when the thickness ratio is 7.00 and the normalized shear stress is 0.6, the resin 7 survives more than ten times longer under the thermal cycles. When the thickness of the semiconductor chip 2 is 100 µm, that is, when the thickness ratio is 15.00 and the normalized shear stress is 0.15, the resin does not delaminate at the edges 2a of the semiconductor chip 2 in the thermal cycles.

Therefore, the thinner the semiconductor chip 2, that is, the larger the thickness ratio and the smaller the shear stress, the less likely the resin 7 is to delaminate at the edges 2a of the semiconductor chip 2.

Fifth Embodiment

Figures 11, 12, 13:
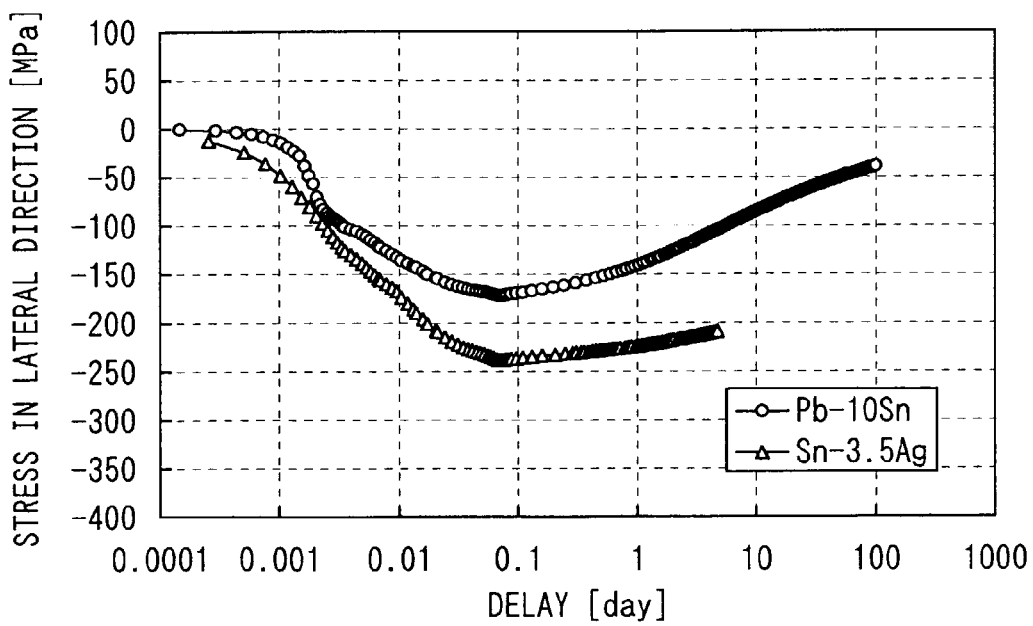
FIG. 11 is a table showing the relative breaking strength and the relative yield stress of typical solders.
FIG. 12 is a table showing the relative strain rate of typical solders.
FIG. 13 is a graph showing the correlation between the residual stress in the semiconductor chip in lateral direction and the delay time.

In the semiconductor device 1 in FIG. 1, according to the fifth embodiment, the solder 6 that joins the semiconductor chip 2 and the heat sink 3 is a Sn-based solder. As shown in FIG. 11, Sn-based solder materials have higher mechanical strengths than Pb-based solders in general. Therefore, by using the Sn-based solder, it is possible to increase the compressive stress in the semiconductor chip 2 after the cooling step in the reflow process. Although there are many possible compositions in Sn-based solders, a composition that results in a higher strength and yield stress than the Pb-based solder is preferably used whether the Sn-based solder includes two or three elements. In FIG. 11, the breaking strengths have been measured under tensile stress tests at 150° C. at a strain rate of 6% per minute, and the yield stresses correspond to 0.2% yield point at 25° C. Furthermore, as shown in FIG. 12, compared to the Pb-based solder, the Sn-based solder has slower strain rates in general, so the compressive stress in the semiconductor chip 2 relaxes at a slower rate when the semiconductor device is placed at room temperature after the cooling step in the reflow process. In FIG. 12, the strain rates have been measured at 50° C. with a stress of 10 MPa. Therefore, as shown as an example in FIG. 13, the Sn-based solders can increase the stress generated in the semiconductor chip 2 and holds preferably the stress, compared to the Pb-based solder. In FIG. 13, the Y-axis represents the magnitude of compressive stress at the center of the semiconductor chip 2.

In above embodiments, the solder foils 8 are used for joining the heat sinks 3 4, the semiconductor chip 2, and the bridging chip 5 to manufacture the semiconductor device 1 in FIG. 1. However, it is also possible to use a solder paste instead of the solder foils 8. In addition, the single semiconductor chip 2 is sandwiched between the heat sinks 3, 4 in the semiconductor device in FIG. 1. However, it is also possible to have two or more chips, or two or more types of chips, sandwiched between the heat sinks 3, 4.

Sixth Embodiment

Figure 14:
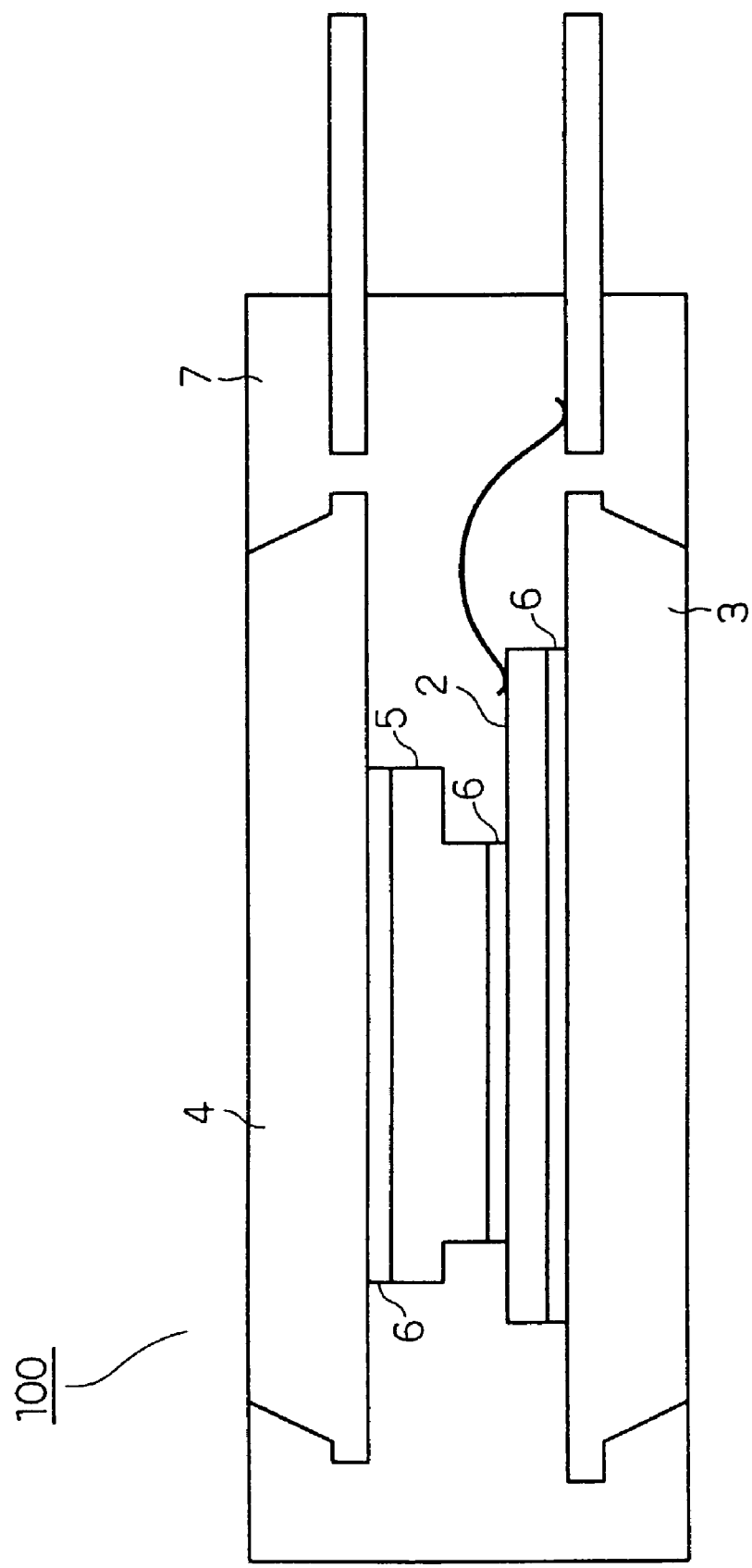
FIG. 14 is a schematic cross sectional view of the semiconductor device according to the sixth embodiment of the present invention.
Figure 15:
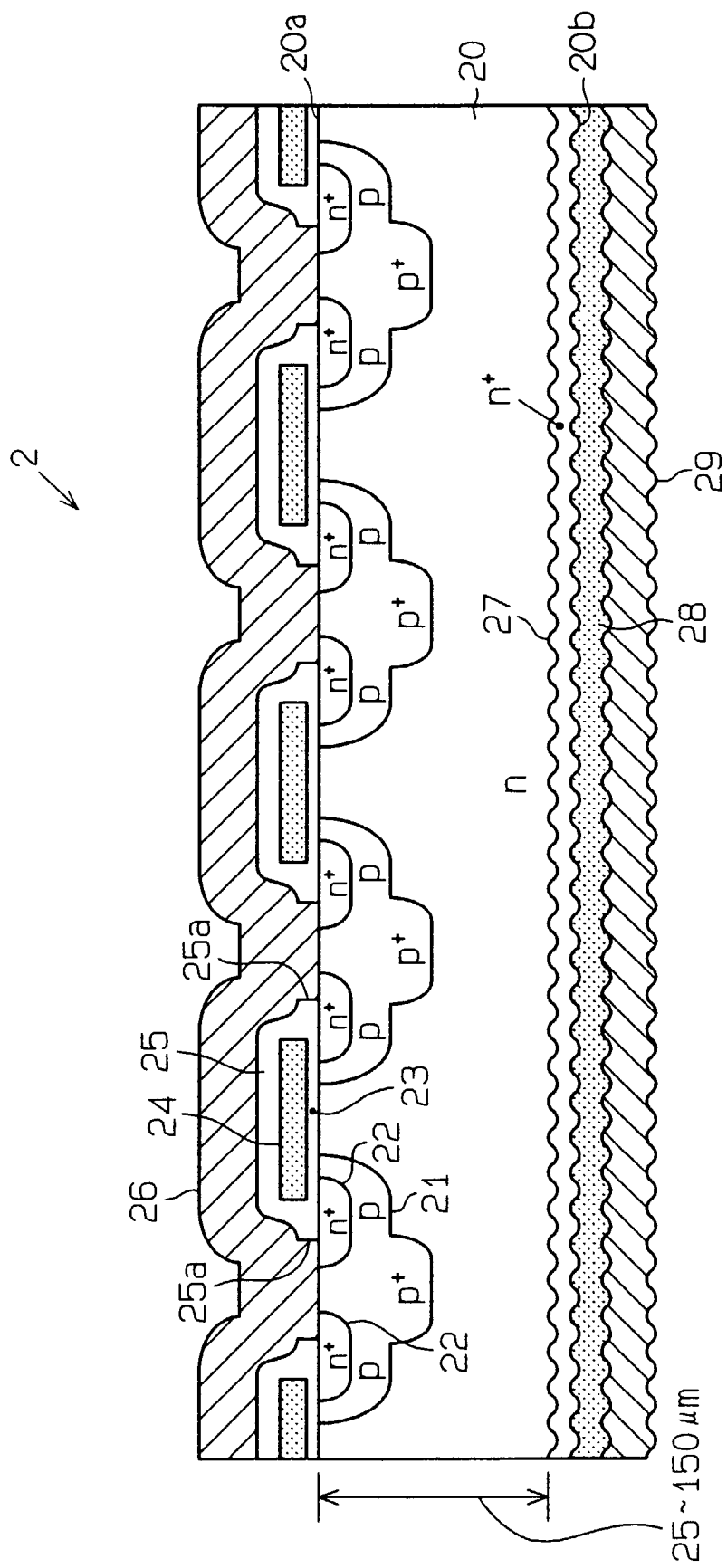
FIG. 15 is a cross-sectional view of the semiconductor chip in the semiconductor device according to the sixth embodiment.

As shown in FIG. 14, a semiconductor device 100 according to the sixth embodiment includes a semiconductor chip 2, which is a vertical power MOSFET 2 of DMOS type, as shown in FIG. 15. The semiconductor device 100 has a similar structure as the semiconductor device 1 in FIG. 1. A solder 6 is in contact with the chip 2 and a bridging chip 5 to connect them. The bridging chip 5 is a plate made of a material having a high thermal conductance. Another solder 6 is in contact with an upper heat sink 4 and the bridging chip 5 to connect them. Other solder 6 is in contact with the chip 2 and a lower heat sink 3 to connect them. Furthermore, the chip 2 is electrically connected to a lead frame by a bonding wire. The chip 2, the bridging chip 5, and the heat sinks 3, 4 are transfer molded with the resin 7. However, an upper surface of the heat sink 4 and a lower surface of the lower heat sink 3 are exposed and not covered by the mold resin 7, as well as in the semiconductor device 1 in FIG. 1.

As shown in FIG. 15, an n-type silicon substrate 20 has a front surface 20a and a back surface 20b, which is opposite from the front surface 20a. The n-type silicon substrate 20 has a thickness of 25 um to 150 µm, so the resistance in the substrate 20 is relatively low with respect to a current flowing in the vertical direction of FIG. 15 and so is the ON resistance of the vertical power MOSFET 2.

A plurality of p-type base regions 21 are located in the front surface 20a. Two n+-type source regions 22 are located in each p-type base region 21. The p-type base regions 21 and the n+-type source regions 22 make up a front impurity-doped region 21, 22. On the front surface 20a, a plurality of polysilicon gate electrodes 24 are located. A gate oxide film 23 is located between each gate electrode 24 and the front surface 20a. An oxide film 25 is located on each polysilicon gate electrode 24 to cover each electrode 24. A source electrode 26 is located on the oxide films 25. The source electrode 26 is substantially made of aluminum. Although not shown, a passivation film is located on the source electrode 26.

On the other hand, an n+-type drain contact region 27 is located in the substantially entire back surface 20b. The n+-type drain contact region 27 is a back impurity-doped region 27 An impurity-doped polysilicon film 28 is located on the substantially entire surface of the n+-type drain contact region 27. A drain electrode 29 is located on the substantially entire surface of the impurity-doped polysilicon film 28. The drain electrode 29 includes titanium, nickel, and gold layers. The n+-type drain contact region 27 is formed by diffusing impurities from the impurity-doped polysilicon film 28. As shown in FIG. 14, the bridging chip 5 is connected to the surface of the vertical power MOSFET 2 on which the front impurity-doped region 21, 22 are located. The lower heat sink 3 is connected to the electrode 29.

Figure 16A:
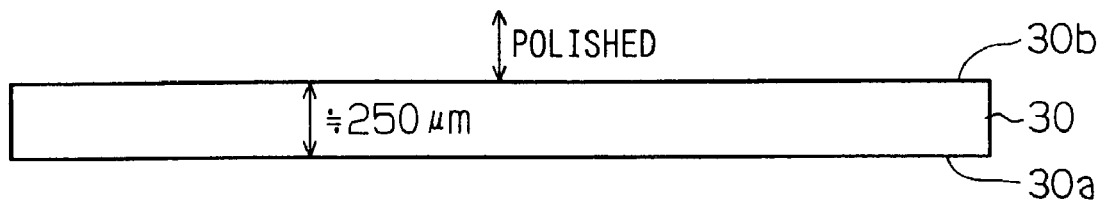
FIGS. 16A to 16D are cross-sectional views showing the manufacturing steps of the semiconductor device according to the sixth embodiment.

The vertical power MOSFET 2 is manufactured as follows. Firstly, the gate oxide films 23 and the polysilicon gate electrodes 24 are formed on the front surface 30a of an n-type silicon wafer 30, which is shown in FIG. 16A. Then, the p-type base regions 21 and the n+-type source regions 22 are formed in the front surface 30a. The oxide films 25 are formed on the polysilicon gate electrodes 24, and the source electrode 26 are formed to have electrical contact with the n-type silicon substrate 30 through contact holes 25a in the oxide films 25.

Figure 16B:
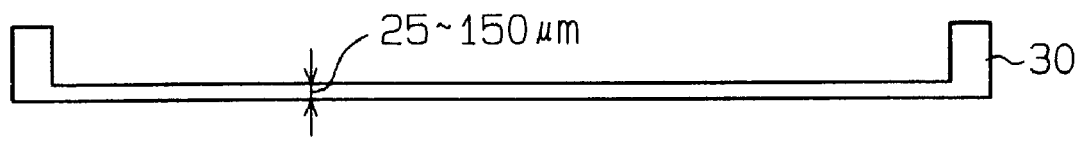

Then, as shown in FIG. 16A, the wafer 30 is thinned to a predetermined thickness by polishing the substantially entire back surface 30b of the wafer 30, which is opposite from the front surface 30a as viewed in FIG. 16A. Specifically, the wafer 30 is thinned to a thickness of approximately 250 μm by surface grinding. Next, as shown in FIG. 16B, the back surface 30b is etched to a predetermined depth, except at the periphery of the wafer 30, by pot etching. By the pot etching, a recess is formed in the wafer 30, as shown in FIG. 16B. Specifically, an etching pot (Pe) shown in FIG. 17 and a pot etching system shown in FIG. 18 are used for the pot etching, and the wafer 30 is etched to have a thickness of approximately 25–150 μm except at the periphery of the wafer. Although the diameter of the wafer 30 is 4 inches to 8 inches, the thicker periphery prevents the wafer 30 from warping.

Figure 17:
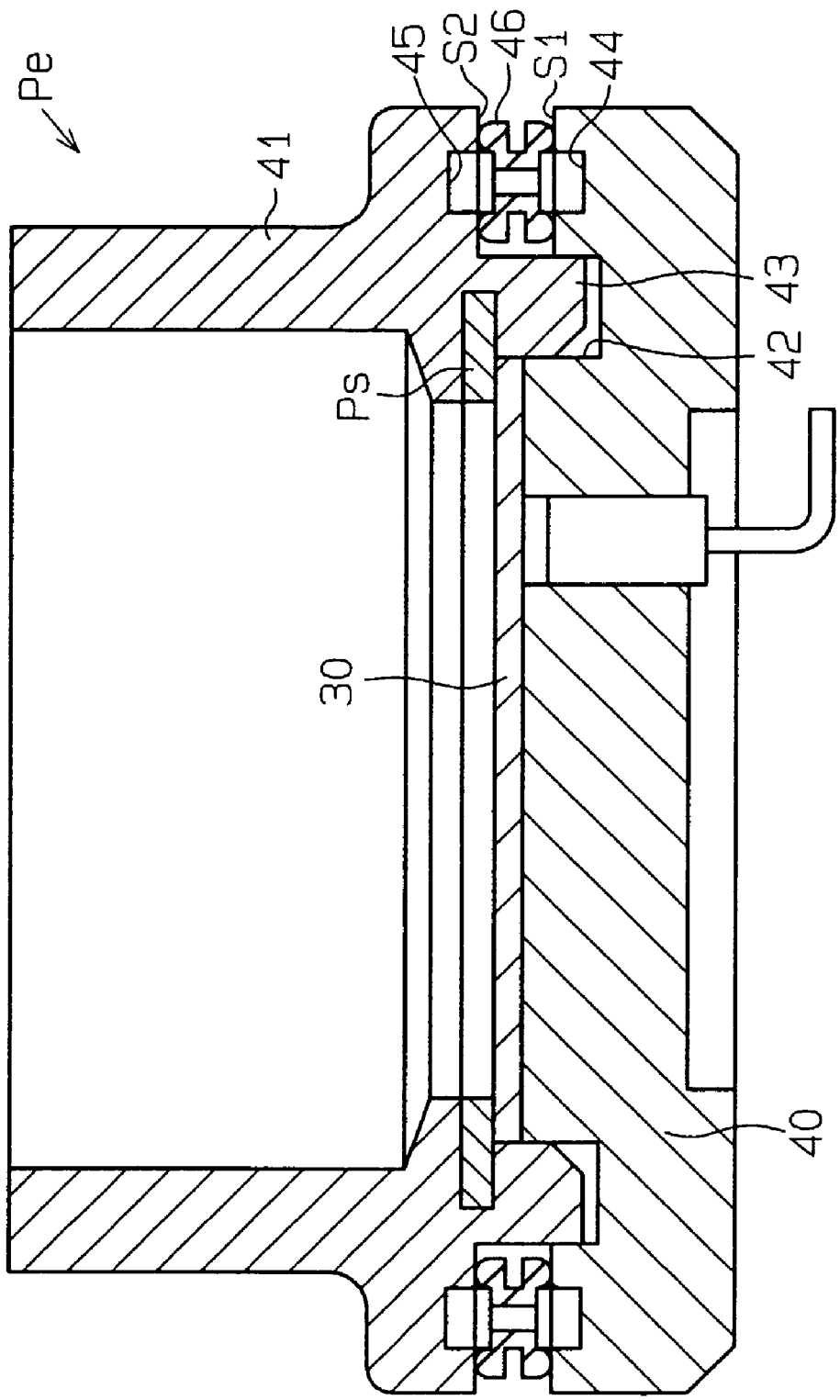
FIG. 17 is a cross-sectional view of the etching pot according to the sixth embodiment.
Figure 18:
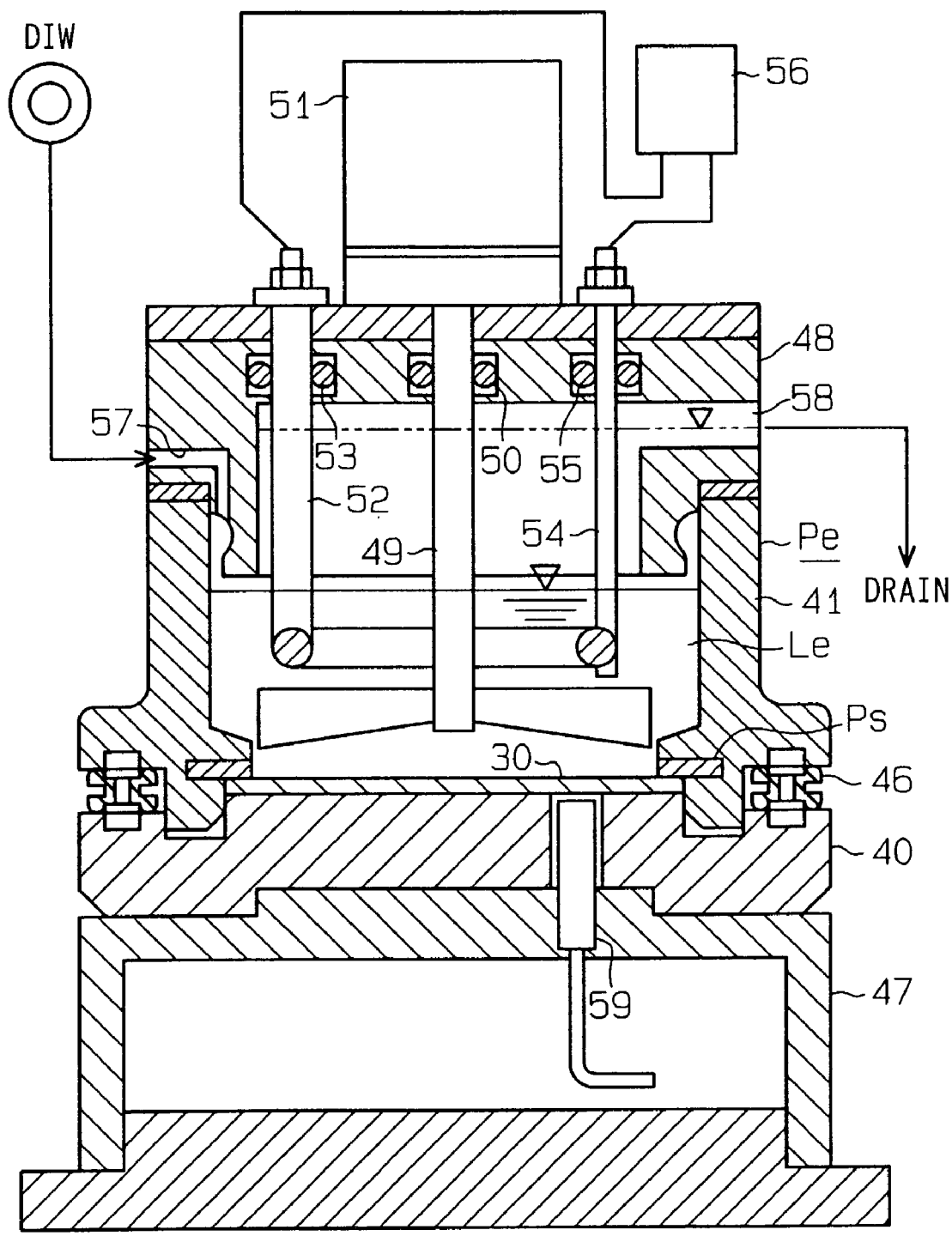
FIG. 18 is a cross-sectional view showing the entire structure of the pot etching system according to the sixth embodiment.

As shown in FIG. 17, the etching pot includes a plate-shaped pot base 40 and a cylinder-shaped pot ring 41. The silicon wafer 30 is placed on top of the pot base 40, and the pot ring 41 is placed on top of the silicon wafer 30 such that the silicon wafer 30 closes the opening of the pot ring 41. The central are of the pot base 40 is a stage for holding the silicon wafer 30. A ring-shaped recess 42 is located at the periphery of the pot base 40 around the stage. A projection 43 of the pot ring 41 fits into the recess 42. The recess 42 is used for aligning the pot ring 41. A lower seal surface S1, which is flat and in a ring shape, is located on the pot base 40 around the recess 42, as viewed in FIG. 17. A ring-shaped recess 44 is located in the lower seal surface S1 to function as a vacuum pocket.

An inner gasket Ps, which is flattened-ring-shaped, is fixed in the inner surface of the lower part of the pot ring 41, as viewed in FIG. 17. The inner gasket Ps prevents an etching solution, which is filled inside the pot ring 41, from leaking out of an etching bath formed by the pot ring 41 and the silicon wafer 30 mounted on the pot base 40. Furthermore, an upper sealing surface S2, which is flat and in a ring shape, is located on a flange of the lower part of the pot ring 41, as viewed in FIG. 17. A ring shaped recess 45 is located in the upper sealing surface S2 to function as a vacuum pocket. An outer gasket 46, which is ring-shaped and has an X-shaped cross section as shown in FIG. 17, is placed between the lower sealing surface S1 and the upper sealing surface S2. By pumping air out of the recesses 44, 45 using a vacuum pump, the X-shaped gasket 46 is shrunken to fix the pot base 40 and the pot ring 41 while permitting the inner gasket Ps to seal a gap between the pot ring 41 and the wafer 30.

The etching pot with the structure described above is set in a pot etching system, as shown in FIG. 18. Then, an etching solution Le is supplied into the etching pot. The inner gasket Ps does not only seal the gap between the pot ring 41 and the wafer 30 in the etching solution Le, but also masks the periphery of the silicon wafer 30 from the etching solution Le. Therefore, as the inside of the etching pot is filled with the etching solution Le, only the back surface 30b of the silicon wafer 30, except for the periphery, contacts the etching solution Le.

More specifically, the etching pot is mounted on to a pot stage 47, and the upper opening of the etching pot is plugged with a lid 48. A stirrer 49 is supported by the lid 48 while being sealed with a sealing material 50. The stirrer 49 is driven by a motor 51 to agitate the etching solution Le. A heater 52 for heating the etching solution Le is supported by the lid 48 while being sealed with a sealing material 53. A temperature sensor 54 for measuring the temperature of the etching solution Le is supported by the lid 48 while being sealed with a sealing material 55. During the etching by the pot etching system in FIG. 18, the etching solution Le is continuously agitated by the stirrer 49, while the heater 52 is electrically controlled by a temperature controller 56 to keep the temperature of the etching solution Le at a predetermined temperature, which is sensed by the temperature sensor 54.

Furthermore, the lid 48 includes a path 57 for deionized water (DIW), so deionized water can be supplied into the etching pot falling down along the inner wall of the pot ring 41. The lid 48 also includes a drain opening 58 for draining out waste water by overflowing from the etching pot. The pot base 40 includes a thickness sensor 59, which measures the thickness of the silicon wafer 30 at the recess to monitor the progress of etching and detects the etching end point. When a predetermined thickness is etched and the thickness of the wafer 30 at the recess becomes a predetermined thickness, deionized water is supplied into the etching pot through the path 57 to dilute and cool off the etching solution Le and stop the etching process, overflowing waste water is drained out from the drain opening 58. Then, the vacuum pump stops pumping out air from the recesses 44, 45, and the recesses 44, 45 are brought back to the atmospheric pressure. Then, the lid 48 and the pot ring 41 removed. At this stage, the etched silicon wafer 30 has the cross-sectional structure shown in FIG. 16B.

Figure 16C:
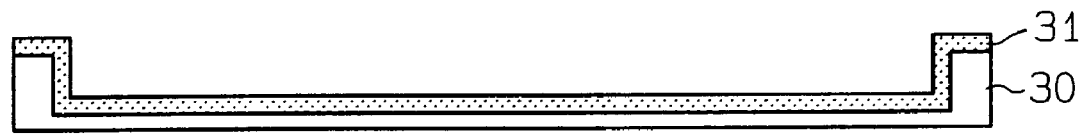
Figure 16D:
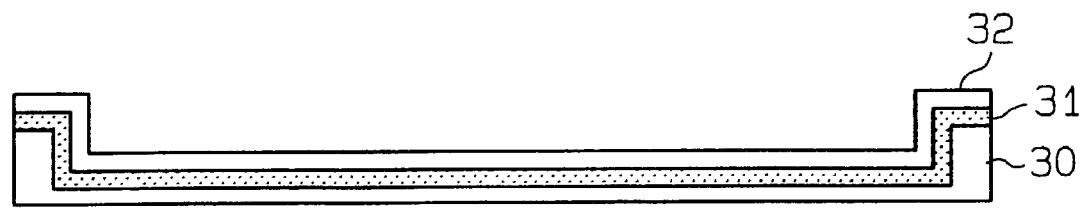

Next, as shown in FIG. 16c, an impurity-doped polysilicon film 31 for forming the impurity-doped polysilicon film 28 in FIG. 15 is deposited on the etched back surface 30b of the wafer 30. Impurities are diffused from the impurity-doped polysilicon film 31 into the wafer 30 for forming the n+-type drain contact region 27 in the back surface 30b of the wafer 30. More specifically, the impurity-doped polysilicon film 31 is deposited at less than 450° C. by a low pressure CVD or a PVD such as sputtering method. Polysilicon has a diffusion rate that is several times higher than a single crystal and is capable of holding a high concentration of impurities between the crystal grains. As a result, polysilicon is capable of injecting a high concentration of impurities in the back surface 30b, even after the aluminum source electrode 26 is formed. Thus, by depositing the impurity-doped polysilicon film 31 and by doping the impurities from the impurity-doped polysilicon film 31 by thermal treatment, the n+-type drain contact region 27, which enables a low-resistance ohmic contact between the substrate 20 and the drain electrode 29 in the semiconductor chip 2, is formed at a temperature lower than 450° C.

Figure 19:
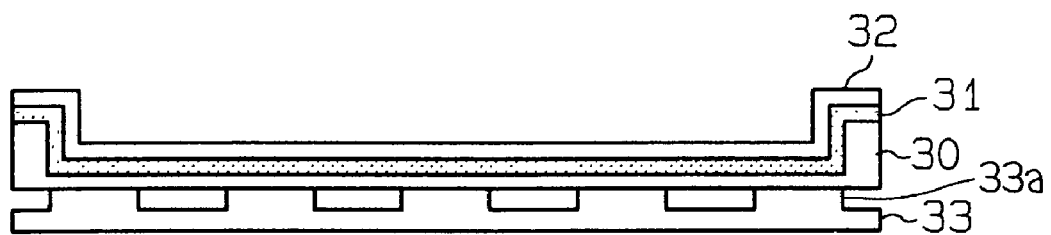
FIG. 19 is a cross-sectional view showing a manufacturing step of the semiconductor device according to the sixth embodiment.
Figure 20:
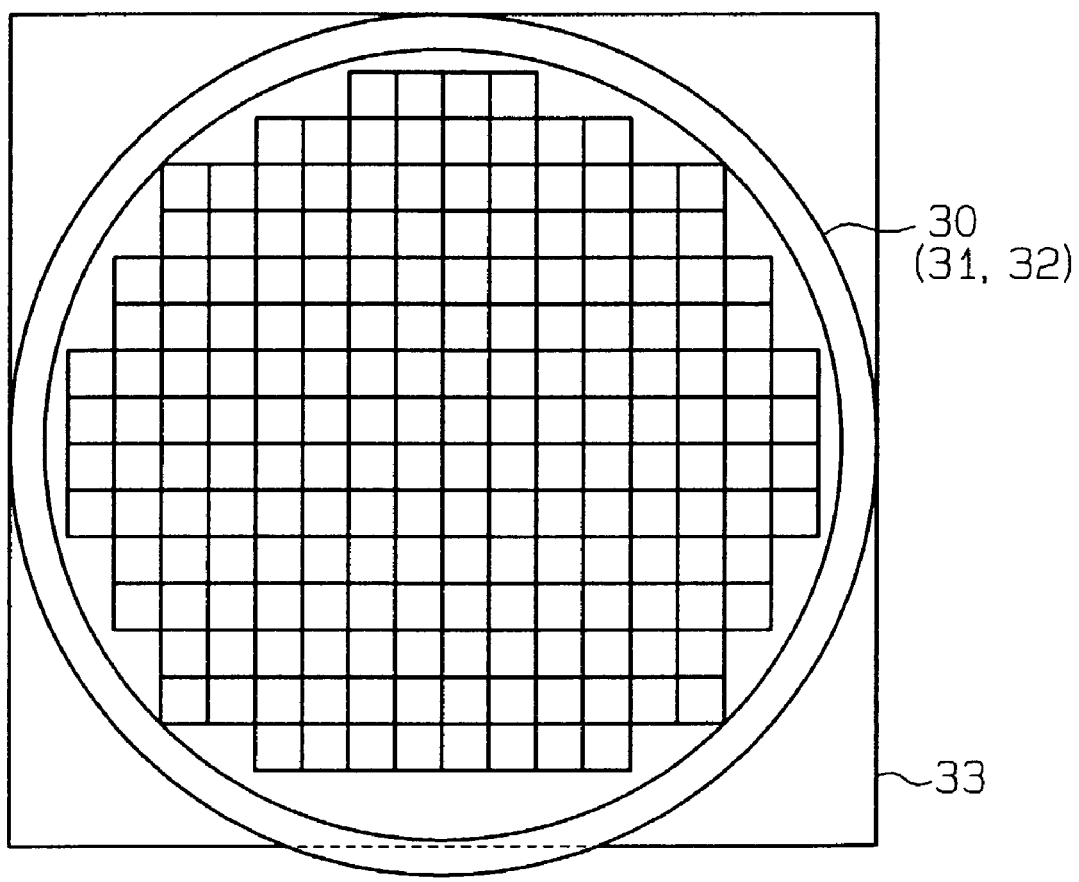
FIG. 20 is a plan view showing the same manufacturing step as in FIG. 19 where a copper plate is soldered to a wafer.

Next, as shown in FIG. 16 D, a back side electrode 32 for forming the drain electrode 29 is deposited on the impurity-doped polysilicon film 31. Specifically, Ti, Ni, and Au films are deposited in this order. Next, as shown in FIGS. 19 and 20, a copper plate 33, which has relatively high thermal conductance, is soldered onto the front surface 30a of the wafer 30, on which the source electrode 26 is located. Then, the wafer 30 and the copper plate 33 are simultaneously diced and separated into a plurality of soldered chips, each of which includes a semiconductor chip 2 and a bridging chip 5. There is an advantage in soldering the copper plate 33 and the wafer 30 before dicing the wafer 30. If the wafer 30 were diced into a plurality of semiconductor chips 2 without having been supported by the copper plate 33, the semiconductor chips 2 would be difficult to handle after the dicing because the semiconductor chips 2 are as thin as 25 to 150 μm, as shown in FIG. 16B. On the other hand, the soldered chips are much easier to handle because of bridging chip 5 soldered to the semiconductor chip 2.

Figure 21:
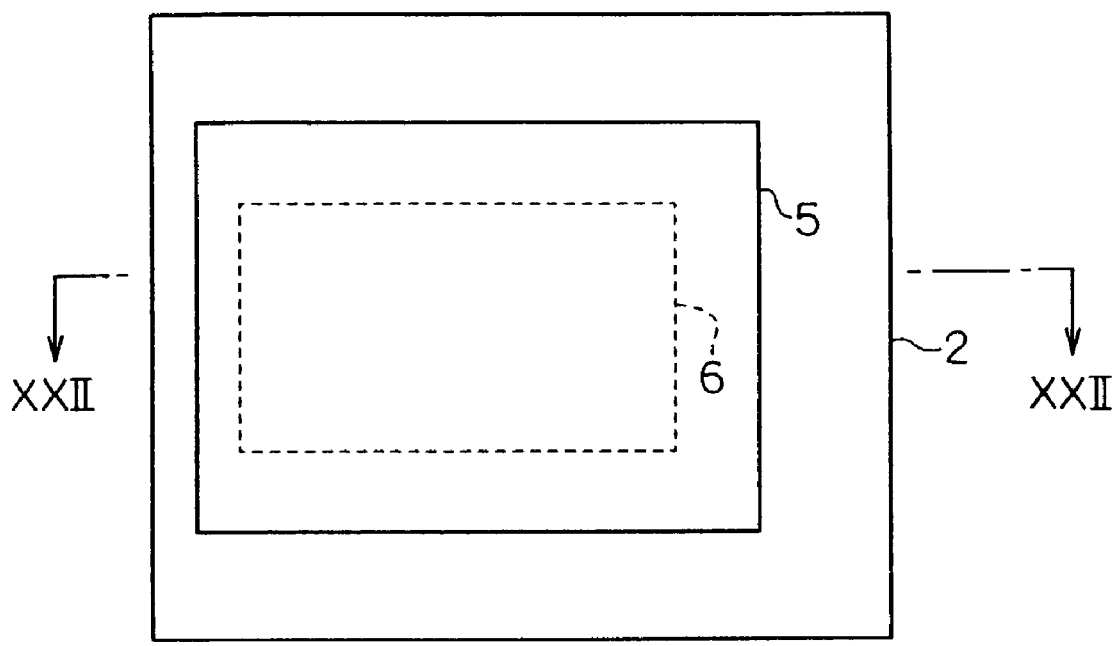
FIG. 21 is a plan view showing a manufacturing step of the semiconductor device according to the sixth embodiment.
Figure 22:
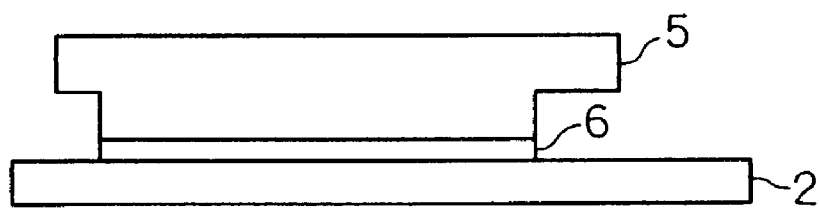
FIG. 22 is a cross sectional view taken along the line XXII—XXII in FIG. 21.

As shown in FIGS. 19 and 20, the wafer 30 is disk shaped, and the copper plate 33 is square shaped. A plurality of projections 33a are formed on the plate 33. Each projection 33a matches with each source electrode 26 located on each semiconductor chip 2 in the wafer 30. In the copper plate 33 in FIGS. 19 and 20, each projection 33a is square shaped. The projections 33a may be formed on the plate 33 by electroless plating a nickel film on a flat copper plate and by pressing the nickel film. When the plate 33 is soldered to the wafer 30, each projection 33a of the plate 33 is aligned to the corresponding source electrode 26 on each chip 2 of the wafer 30. As shown in FIGS. 21 and 22, in each soldered chip after dicing, the solder 6 is in contact with the bridging chip 5 and the source electrode 26 of the semiconductor chip 2 to connect the semiconductor chip 2 and the bridging chip 5 electrically and mechanically. Next, as shown in FIG. 14, the heat sinks 3, 4 are respectively soldered to the semiconductor chip 2 and the bridging chip 5 of each soldered chip. Then, the heat sinks 3, 4, the semiconductor chip 2, and the bridging chip 5 are transfer molded such that the upper surface of the heat sink 4 and the lower surface of the lower heat sink 3 are exposed, as shown in FIG. 14.

By the pot etching method according to the sixth embodiment, it is possible to thin an active region of the wafer 30, where the semiconductor chips 2 are formed, while keeping the periphery of the wafer 30 thicker. Therefore, it is possible to form the drain contact electrode 29 on the back surface of the wafer 30 without generating a warp in the wafer 30 using, for example, sputtering, and it is also possible to avoid problems related to mechanical-strength issues in the wafer 30. In addition, the manufacturing costs of the semiconductor chips 2 are reduced because there is no need to form an epitaxial layer for making the substrate 20 on a wafer, which has a preferable impurity concentration for making the n$^+$-type drain contact region 27.

In the manufacturing method according to the sixth embodiment, the n$^+$-type drain contact region 27, which is a highly-doped impurity layer 27, is formed using the impurity-doped polysilicon film 31, which makes up the impurity-doped polysilicon film 28, in the back surface 30b of the wafer 30 after the p-type base regions 21 and the n$^+$-type source regions 22, the aluminum source electrode 26, and the passivation film such as SiN and PIQ are formed on the front surface 30a of the wafer 30. However, because the highly-doped impurity layer 27, which enables low-resistance ohmic contact to be formed on the backside electrode 32, is formed by diffusing impurities from the impurity-doped polysilicon film 31 at a preferably low process temperature, the back side electrode contact can be established at a preferably low process temperature in the manufacturing process of the semiconductor device 100. Therefore, it is possible to ensure higher device reliability than the proposed methods described below.

Conventionally, the highly-doped impurity layer 27 is formed either by ion implanting or thermal diffusion. The ion implanting needs a post-processing annealing at 500–700° C. for activating close to 100% of the ions implanted at a high dose. On the other hand, the thermal diffusion needs a higher temperature and longer time period than the ion implanting. However, the processing temperature must be kept lower than 450° C., at which aluminum softens, because the process takes place after the aluminum source electrode 26 is formed on the front surface 30a of the wafer 30. Therefore, in the proposed methods, the annealing effect is insufficient.

Figure 23:
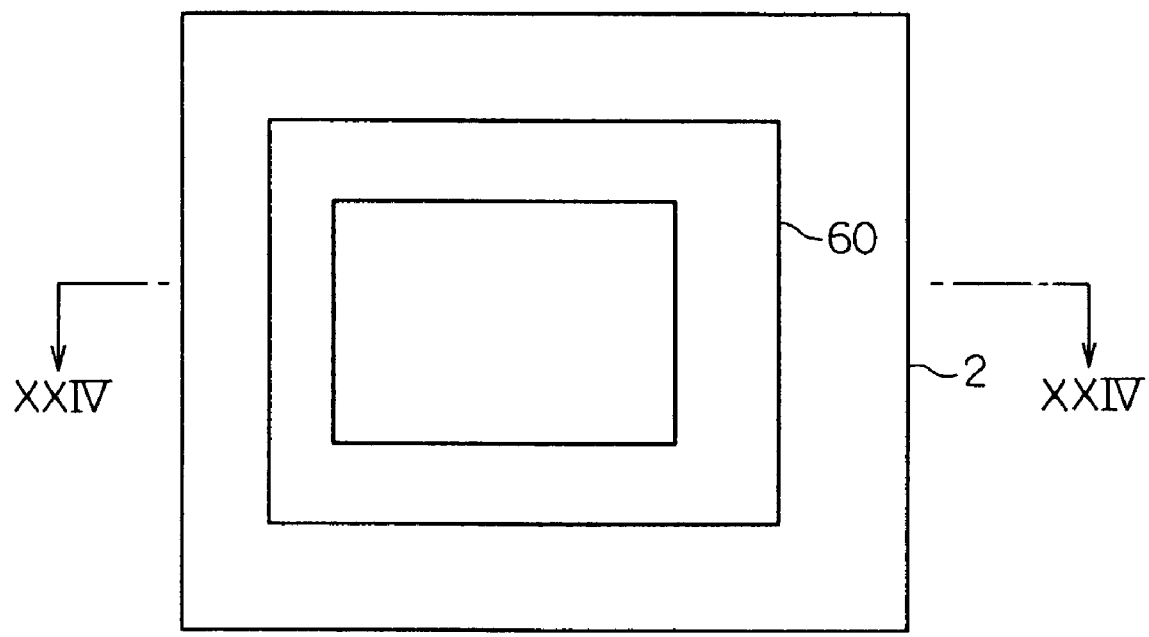
FIG. 23 is a plan view showing a variation in structure of the bridging chip according to the sixth embodiment.
Figure 24:
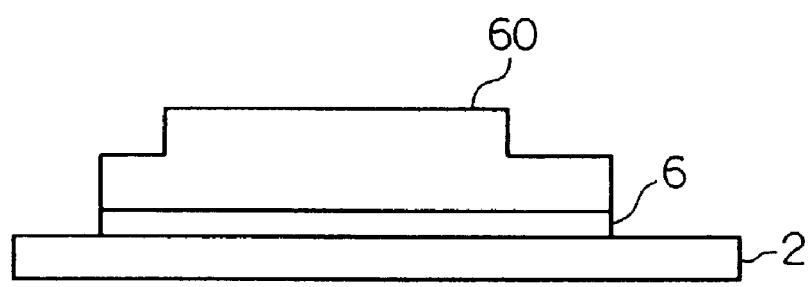
FIG. 24 is a cross sectional view taken along the line XXIV—XXIV in FIG. 23.
Figure 25:
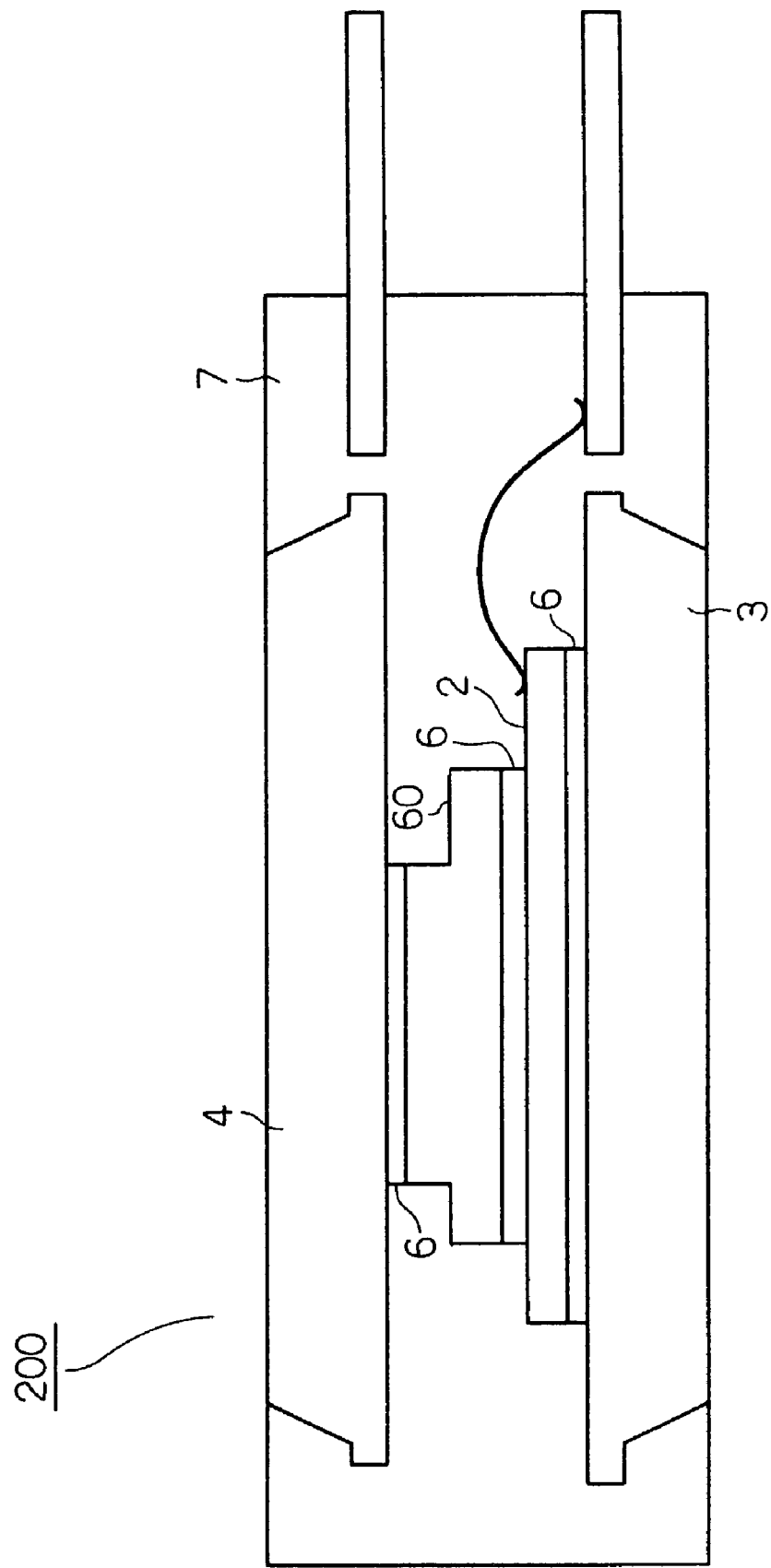
FIG. 25 is a schematic cross sectional view of a semiconductor device including a bridging chip shown in FIGS. 23 and 24.

In FIGS. 14, 21, and 22, the surface of the bridging chip 5 that faces the semiconductor chip 2 is smaller than the surface of the bridging chip 5 that faces the heat sink 4. However the relation in size may be opposite as a bridging chip 60 in FIGS. 23, 24, and 25.

Figure 26:
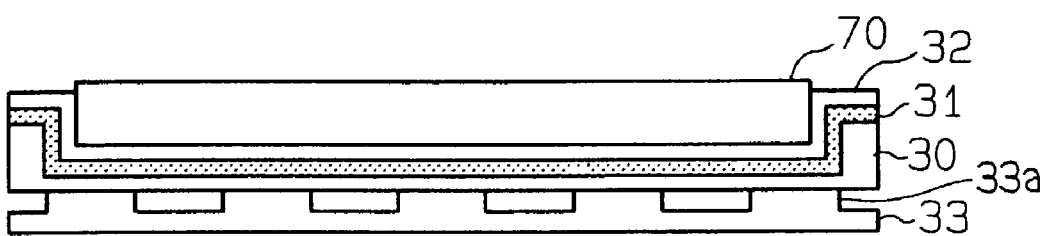
FIG. 26 is a cross sectional view showing a manufacturing process of a semiconductor device including another bridging chip.
Figure 27:
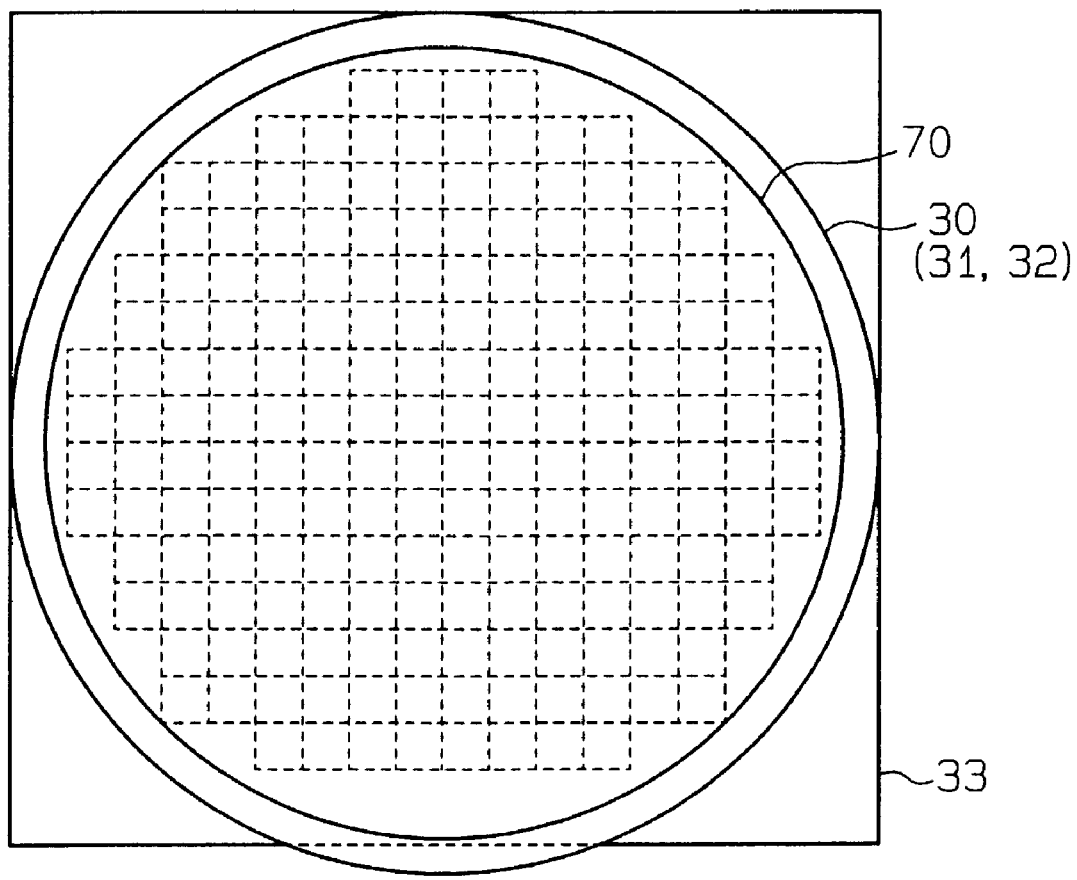
FIG. 27 is a plan view showing the same manufacturing step as in FIG. 26 where two copper plates are soldered to a wafer.
Figure 28:
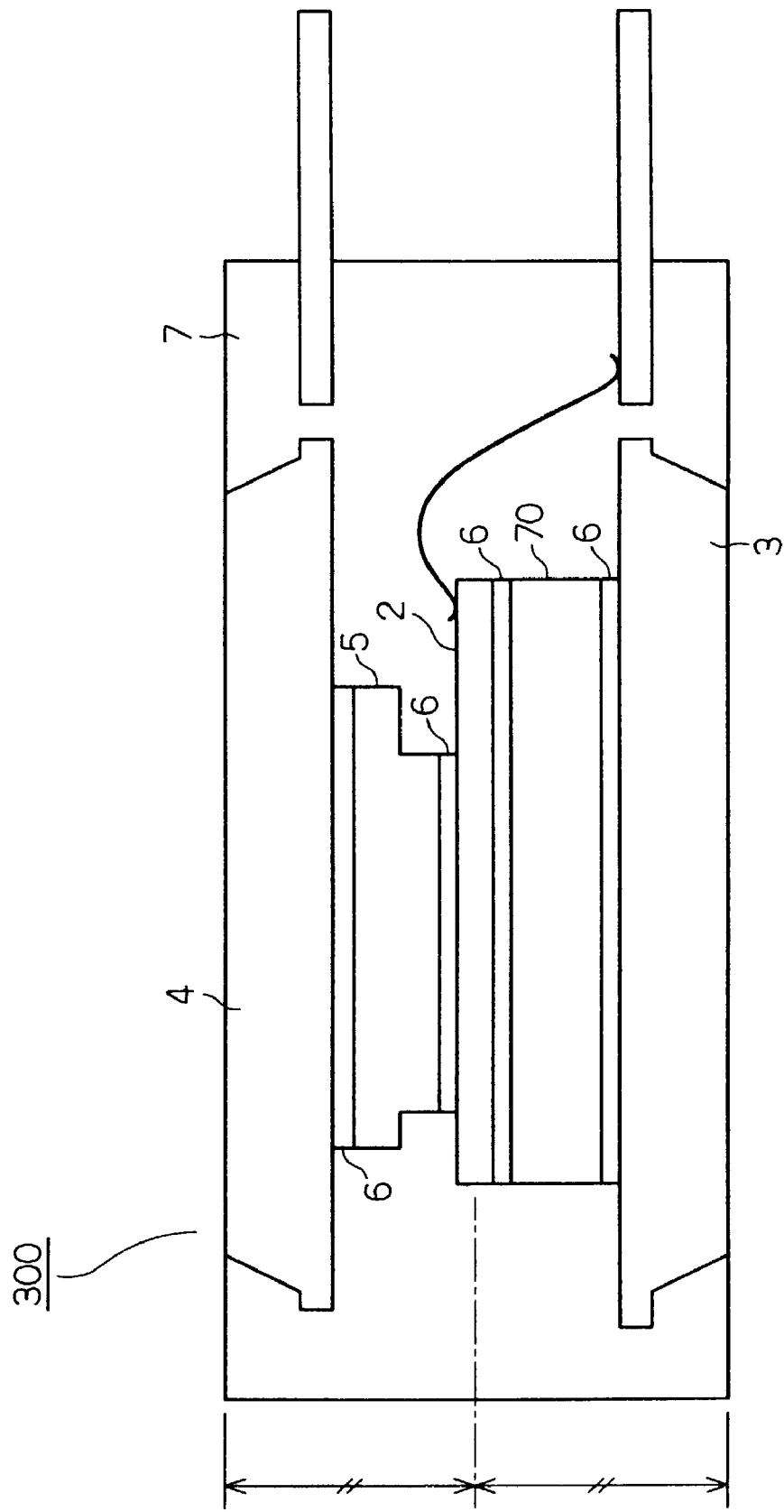
FIG. 28 is a schematic cross sectional view of a semiconductor device including two bridging chips shown in FIGS. 26 and 27.

Furthermore, as shown in FIGS. 26 and 27, another copper plate 70, which has a high thermal conductance, may be soldered onto the back side electrode 32 of the wafer 30. The copper plate 70 can be soldered when the copper plate 33 is soldered onto the source electrode 26 of the wafer 30. Then, the wafer 30 and the copper plates 33, 70 are diced and separated into a plurality of soldered chips. Then, each chip is soldered to the heat sinks 3, 4, and molded with the resin 7 to complete a semiconductor device 300 shown in FIG. 28. In the semiconductor device 300 shown in FIG. 28, the semiconductor chip 2 is positioned substantially at the center of the device 300 in the vertical direction of FIG. 28 by the plate 70, which separates the silicon chip 2 and the lower heat sink 3. As a result, the heat release capability is improved, and the thermal strain in the device 300 becomes more balanced, and the stress in the chip 2 due to the strain decreases. Thus, the device 300 has preferable durability in heat cycling.

In the semiconductor devices 1, 100, 200, 300 according to the above embodiments, the semiconductor chip 2 is a vertical MOSFET. However, the chip 2 may also be a vertical IGBT (insulated gate bipolar transistor). In that case, the back side electrode 29 functions as a collector electrode.

What is claimed is:

1. A semiconductor device comprising:
   a semiconductor chip that generates heat in operation;
   a pair of metal plates for releasing the heat from the semiconductor chip to cool the semiconductor chip, wherein the metal plates are directly joined to end surfaces of the semiconductor chip, respectively, by a solder material; and
   a mold resin, in which the semiconductor chip and the metal plates are molded, wherein a thickness t1 of the semiconductor chip and a thickness t2 of at least one of the metal plates satisfy an equation of $t2/t1 \geq 5$.

2. The semiconductor device in claim 1, wherein the metal plates have a thermal expansion coefficient α1 and the mold resin has a thermal expansion coefficient α2 such that the thermal expansion coefficient α1 and the thermal expansion coefficient α2 satisfy an equation of $0.5 \leq \alpha2/\alpha1 \leq 1.5$.

3. The semiconductor device in claim 1, wherein the end-surfaces of the semiconductor chip have a surface roughness Ra that satisfies an equation of $Ra \leq 500$ nm.

* * * * *